(12) United States Patent
Saneyoshi et al.

(10) Patent No.: US 10,495,674 B2
(45) Date of Patent: Dec. 3, 2019

(54) MONITORING DEVICE, MONITORING SYSTEM, MONITORING METHOD, CORRECTION INFORMATION GENERATION DEVICE, CORRECTION INFORMATION GENERATION METHOD, AND NON-TRANSITORY STORAGE MEDIUM

(71) Applicant: NEC Corporation, Tokyo (JP)

(72) Inventors: Eisuke Saneyoshi, Tokyo (JP); Takahiro Toizumi, Tokyo (JP); Kosuke Homma, Tokyo (JP); Ryo Hashimoto, Tokyo (JP); Katsuya Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 424 days.

(21) Appl. No.: 15/115,152

(22) PCT Filed: Jan. 7, 2015

(86) PCT No.: PCT/JP2015/050243
§ 371 (c)(1),
(2) Date: Jul. 28, 2016

(87) PCT Pub. No.: WO2015/115137
PCT Pub. Date: Aug. 6, 2015

(65) Prior Publication Data
US 2016/0349294 A1    Dec. 1, 2016

(30) Foreign Application Priority Data

Jan. 29, 2014  (JP) ................................ 2014-014002
Aug. 22, 2014  (JP) ................................ 2014-169097

(51) Int. Cl.
*G01R 1/02*      (2006.01)
*G01R 21/133*    (2006.01)
*G01R 19/25*     (2006.01)

(52) U.S. Cl.
CPC ....... *G01R 21/133* (2013.01); *G01R 19/2513* (2013.01)

(58) Field of Classification Search
CPC .. G01R 21/133; G01R 21/06; G01R 19/0092; G01R 1/203; G01R 31/2642;
(Continued)

(56) References Cited

U.S. PATENT DOCUMENTS 7,714,735 B2 *  5/2010  Rockwell ........... G01R 19/2513
                                                    324/126
8,600,685 B2 * 12/2013  Kalgren .................. G01D 3/08
                                                    702/109

(Continued)

FOREIGN PATENT DOCUMENTS

JP        3403368      5/2003
JP        2006-17456   1/2006
(Continued)

OTHER PUBLICATIONS

Notification of Reasons for Refusal dated Oct. 23, 2018, by Japanese Patent Office in counterpart Japanese Patent Application 2015-559843.
(Continued)

*Primary Examiner* — Thang X Le
(74) *Attorney, Agent, or Firm* — Finnegan, Henderson, Farabow, Garrett & Dunner, L.L.P.

(57) ABSTRACT

A monitoring device (10) includes a feature amount storage unit (11) that stores a device feature amount which is a feature amount of each of a plurality of electrical devices installed in a predetermined unit in operation; a measured data acquisition unit (12) that acquires measured data of the predetermined unit which is at least one of a total current consumption, a total power consumption, and a voltage measured in the predetermined unit; a feature amount extraction unit (13) that acquires a measurement feature amount which is the feature amount included in the measured data of the predetermined unit; a correction unit (15) that corrects a first feature amount which is the device
(Continued)

feature amount or the measurement feature amount based on unit feature information indicating a feature of the predetermined unit; and a presumption unit (16) that presumes the electrical device being in operation using the corrected first feature amount, and a second feature amount which is the device feature amount or the measurement feature amount, and a different feature amount from the first feature amount.

30 Claims, 18 Drawing Sheets

(58) Field of Classification Search
CPC ...... G01R 13/345; G01R 23/16; G01R 27/32; G01R 13/0272; G01R 19/04; H04L 41/06; H04L 41/16; H04L 41/5032; H04L 41/5009; G06F 9/3802; G06F 2221/2137
See application file for complete search history.

(56) References Cited

U.S. PATENT DOCUMENTS

| | | | | |
|---|---|---|---|---|
| 8,665,102 | B2* | 3/2014 | Salewske | G01R 19/2513 |
| | | | | 324/522 |
| 9,897,665 | B2* | 2/2018 | Taft | G01D 4/002 |
| 2013/0031385 | A1* | 1/2013 | Seto | G06F 1/28 |
| | | | | 713/300 |
| 2013/0187665 | A1 | 7/2013 | Rietman et al. | |
| 2016/0004297 | A1* | 1/2016 | Kazuno | G06Q 30/06 |
| | | | | 713/320 |
| 2018/0299917 | A1* | 10/2018 | Kamel | G01R 21/1333 |

FOREIGN PATENT DOCUMENTS

| | | |
|---|---|---|
| JP | 2006-158082 | 6/2006 |
| JP | 2006-343063 | 12/2006 |
| JP | 2007-225374 | 9/2007 |
| JP | 4433890 | 3/2010 |
| JP | 2010-210575 | 9/2010 |
| JP | 4565511 | 10/2010 |
| JP | 2011-17674 | 1/2011 |
| JP | 2012-184985 | 9/2012 |
| JP | 2013-538552 | 10/2013 |
| JP | 2013-238523 | 11/2013 |
| JP | 2015-21775 | 2/2015 |
| JP | 6221443 | 11/2017 |
| WO | WO 2014/097458 A1 | 6/2014 |

OTHER PUBLICATIONS

International Search Report and Written Opinion dated Mar. 17, 2015, in corresponding PCT International Application.
Decision to Grant a Patent dated May 28, 2019, by Japanese Patent Office in counterpart Japanese Patent Application 2015-559843.

* cited by examiner

MONITORING DEVICE, MONITORING SYSTEM, MONITORING METHOD, CORRECTION INFORMATION GENERATION DEVICE, CORRECTION INFORMATION GENERATION METHOD, AND NON-TRANSITORY STORAGE MEDIUM

CROSS-REFERENCE TO RELATED PATENT APPLICATIONS

This application is a National Stage Entry of International Application No. PCT/JP2015/050243, filed Jan. 7, 2015, which claims priority from Japanese Patent Application No. 2014-014002, filed Jan. 29, 2014, and Japanese Patent Application No. 2014-169097, filed Aug. 22, 2014. The entire contents of the above-referenced applications are expressly incorporated herein by reference.

TECHNICAL FIELD

The present invention relates to a monitoring device, a monitoring system, a monitoring method, a correction information generation device, a correction information generation method, and a program.

BACKGROUND ART

In recent years, systems called home energy management system (HEMS) which perform energy management of housing have been provided for electricity users of general households. The HEMS is a system that utilizes sensors or information technologies. According to the HEMS, electricity use conditions in each household can be ascertained and visualized. As a result, power saving and a reduction in electricity charges are promoted, and thus energy saving effects are expected to be obtained. Such efforts have expanded and started to be applied to areas such as office floors, buildings, and stores.

Technologies for ascertaining operation states of individual electrical devices in households and the like and visualizing such information have been proposed. According to the technologies, it is possible to ascertain individual operation states (types or the like of electrical devices being in operation) of electrical devices at the present point in time in each household and also ascertain use pattern or the like of each electrical device. The related technologies are disclosed in Patent Documents 1 to 4.

Patent Document 1 discloses a technology for ascertaining power consumption of individual electrical devices by including dedicated power consumption measurement devices in the individual electrical devices.

Patent Documents 2 and 3 disclose technologies for presuming operation states of individual electrical devices without directly measuring the power consumption of the individual electrical devices. Specifically, technologies are disclosed in which measurement sensors measuring feature amounts such as power supply currents, power supply voltages, or calculated values such as a statistic obtained from the power supply currents and the power supply voltages are installed in power trunk line portions such as switchboards, and it is presumed which electrical devices are operated using feature amounts (reference information), which are stored in advance, at the time of the operation of electrical devices and measurement results of the measurement sensors.

Patent Document 4 discloses a technology for generating feature amounts (reference information) which are necessary for presuming operation states of the foregoing individual electrical devices. Specifically, a technology is disclosed in which predetermined pieces of data (current consumption or the like) are individually measured by operating the electrical devices one by one in measured housing, and feature amounts are extracted from the pieces of measured data of the respective electrical devices and are preserved.

RELATED DOCUMENT

Patent Document

[Patent Document 1] Japanese Patent Application Laid-open Publication No. 2007-225374
[Patent Document 2] Japanese Patent No. 3403368
[Patent Document 3] Japanese Patent No. 4565511
[Patent Document 4] Japanese Patent No. 4433890

SUMMARY OF THE INVENTION

Technical Problem

In the technology disclosed in Patent Document 1, the power consumption measurement device is installed in the individual electrical device, and thus the same number of power measurement sensors as the number of electrical devices have to be prepared. For this reason, since the cost of the entire system is high, there is a problem that it is difficult for users to introduce the system.

As in the technologies of Patent Documents 2 to 4, according to a technology for comparing feature amounts obtained by combining prepared feature amounts (hereinafter referred to as "reference feature amounts") of a plurality of electrical devices to, for example, a feature amount (hereinafter referred to as a "measurement feature amount") extracted from measured data such as a total current consumption, a total power consumption, or a voltage in a predetermined unit (for example, each household, a specific room of a certain household, or each office) measured in a distribution board, and thus presuming the operation states of the electrical devices in the predetermined unit, it is possible to solve the problem of the technology disclosed in the foregoing Patent Document 1.

In the case of this technology, however, it is necessary to prepare in advance the reference feature amount of each electrical device installed in the predetermined unit and stores the reference feature amount in the system. In the related art, there is no technology for efficiently generating such a reference feature amount and storing the reference feature amount in the system.

Patent Document 4 discloses the technology for operating a plurality of electrical devices installed in a measured housing one by one, measuring a total load current and voltage of each electrical device, and generating the reference feature amount using the measured data. In the case of this technology, however, there is a problem that while a certain electrical device is measured to generate the reference feature amount, the other electrical devices cannot be operated. That is, the restriction that the other electrical devices installed in the measured housing may not be operated during the measurement may be imposed on users. The measurement may not be performed in a case in which electrical devices such as refrigerators which are supposed to be operated constantly are operating.

Accordingly, the inventors of the present specification have examined a technology for generating the reference feature amount of each electrical device using measured data (for example, a current consumption, a power consumption, or a voltage) measured when the same kind of electrical device as an electrical device installed in a predetermined unit (for example, each household, a specific room in a certain household, or each office) is placed in another location (for example, a research room or a laboratory room). According to this technology, the foregoing problem occurring in the technology disclosed in Patent Document 4 can be solved. However, the inventors of the present application have newly found the following problems in the examined technology.

There is a high possibility that a relation between an electrical device and a measuring instrument at the time of measurement of the measured data for extracting the reference feature amount is different from a relation between the electrical device and the measuring instrument in a predetermined unit. The relation between the measuring instrument and the electrical device includes all of factors which have an influence on the measured data. For example, the length of an interconnect between the measuring instrument and the electrical device, the number or the lengths of interconnects branched from the interconnect, the number or kinds of other electrical devices connected to the interconnects are considered.

For example, a relation between an electrical device and a measuring instrument in a predetermined unit is illustrated in FIG. 12. In a case of focusing on an electrical device A in FIG. 12, for example, it can be understood that a plurality of branches are present in an interconnect which connects the measuring device installed near a switchboard and the electrical device A and a plurality of other electrical devices B to D are connected to the branches. On the other hand, for example, FIG. 13 illustrates a relation between the measuring instrument and the electrical device A when the electrical device A is measured to extract the reference feature amount of the electrical device A in a research room or the like. In FIG. 13, the measuring instrument and the electrical device A are connected in a one-to-one manner. When FIG. 12 is compared to FIG. 13, the length of an interconnect between the measuring instrument and the electrical device A, the number or lengths of interconnects branched from the interconnect, and the number or kinds of other electrical devices connected to the interconnects are different from each other. The relation between the measuring instrument and the electrical device A in the measurement in a research room or the like is not one-to-one in some cases, as illustrated in FIG. 13. However, even in a case in which the relation is not one-to-one, the relation between the measuring instrument and the electrical device A in the measurement in the research room or the like is rarely identical to the relation between the measuring instrument and the electrical device A in the predetermined unit.

When the relation between the measuring instrument and the electrical device A is different, as described above, the measured data such as a current consumption, a power consumption, or a voltage of the electrical device A measured with the measuring instrument can also be different. That is, the measured data such as a current consumption, a power consumption, or a voltage of the electrical device A measured in the research room or the like can be different from the measured data such as a current consumption, a power consumption, or a voltage of the electrical device A measured in the predetermined unit. In such a case, the prepared reference feature amount of the electrical device A may be different from the feature amount of the electrical device A indicated in the measured data measured in the predetermined unit. As a result, presumption precision of the electrical device being in operation may deteriorate.

An object of the present invention is to provide a technology for reducing a disadvantage of deterioration in precision of a presumption process of presuming an electrical device being in operation in a technology for generating a reference feature amount of each electrical device using measured data (for example, a current consumption, a power consumption, or a voltage) measured when the same kind of electrical device as the electrical device installed in a predetermined unit (for example, each household, a specific room in a certain household, or each office) is placed in another location (for example, a research room or a laboratory room).

Solution to Problem

According to an aspect of the present invention, there is provided a monitoring device including: a feature amount storage unit that stores a device feature amount which is a feature amount of each of a plurality of electrical devices installed in a predetermined unit in operation; a measured data acquisition unit that acquires measured data of the predetermined unit which is at least one of a total current consumption, a total power consumption, and a voltage measured in the predetermined unit; a feature amount extraction unit that acquires a measurement feature amount which is the feature amount included in the measured data of the predetermined unit; a correction unit that corrects a first feature amount which is the device feature amount or the measurement feature amount; and a presumption unit that presumes the electrical device being in operation using the corrected first feature amount, and a second feature amount which is the device feature amount or the measurement feature amount, and a different feature amount from the first feature amount.

According to another aspect of the present invention, there is provided a monitoring device including: a feature amount storage unit that stores a device feature amount which is a feature amount of each of a plurality of electrical devices installed in a predetermined unit in operation; a measured data acquisition unit that acquires measured data of the predetermined unit which is at least one of a total current consumption, a total power consumption, and a voltage measured in the predetermined unit; a feature amount extraction unit that acquires a measurement feature amount which is the feature amount included in the measured data of the predetermined unit; a first correction unit that corrects the device feature amount; a second correction unit that corrects the measurement feature amount; and a presumption unit that presumes the electrical device being in operation using the corrected device feature amount and the corrected measurement feature amount.

According to still another aspect of the present invention, there is provided a monitoring device including: a feature amount storage unit that stores a device feature amount which is a feature amount of each of a plurality of electrical devices installed in a predetermined unit in operation; a measured data acquisition unit that acquires measured data of the predetermined unit which is at least one of a total current consumption, a total power consumption, and a voltage measured in the predetermined unit; a correction unit that corrects the measured data of the predetermined unit; a feature amount extraction unit that acquires a corrected measurement feature amount which is the feature amount included in the corrected measured data of the predetermined unit; and a presumption unit that presumes the electrical device being in operation using the device feature amount and the corrected measurement feature amount.

According to still another aspect of the present invention, there is provided a monitoring device including: a reference data storage unit that stores reference data which is at least one of a current consumption, a power consumption, and a voltage measured using each of a plurality of electrical devices installed in a predetermined unit, placed in a different environment from the predetermined unit; a correction unit that corrects the reference data of each of the plurality of electrical devices; a corrected device feature amount generation unit that acquires a corrected device feature amount which is a feature amount of each of the electrical devices included in each piece of the corrected reference data; a measured data acquisition unit that acquires measured data of the predetermined unit which is at least one of the total current consumption, the total power consumption, and the voltage measured in the predetermined unit; a feature amount extraction unit that acquires a measurement feature amount which is the feature amount included in the measured data of the predetermined unit; and a presumption unit that presumes the electrical device being in operation using the corrected device feature amount and the measurement feature amount.

According to still another aspect of the present invention, there is provided a monitoring device including: a reference data storage unit that stores reference data which is at least one of a current consumption, a power consumption, and a voltage measured using each of a plurality of electrical devices installed in a predetermined unit, placed in a different environment from the predetermined unit; a first correction unit that corrects the reference data of each of the plurality of electrical devices; a corrected device feature amount generation unit that acquires a corrected device feature amount which is a feature amount of each of the electrical devices included in each piece of the corrected reference data; a measured data acquisition unit that acquires measured data of the predetermined unit which is at least one of the total current consumption, the total power consumption, and the voltage measured in the predetermined unit; a second correction unit that corrects the measured data of the predetermined unit; a feature amount extraction unit that acquires a corrected measurement feature amount which is the feature amount included in the corrected measured data of the predetermined unit; and a presumption unit that presumes the electrical device being in operation using the corrected device feature amount and the corrected measurement feature amount.

According to still another aspect of the present invention, there is provided a monitoring system including: the monitoring device; and a transmission device that acquires measured data of a predetermined unit which is at least one of a total current consumption, a total power consumption, and a voltage measured by a measuring instrument installed in the predetermined unit and transmits the measured data to the monitoring device.

According to still another aspect of the present invention, there is provided a monitoring method performed by a computer that stores a device feature amount which is a feature amount of each of a plurality of electrical devices installed in a predetermined unit in operation, the method including: a measured data acquisition step of acquiring measured data of the predetermined unit which is at least one of a total current consumption, a total power consumption, and a voltage measured in the predetermined unit; a feature amount extraction step of acquiring a measurement feature amount which is the feature amount included in the measured data of the predetermined unit; a correction step of correcting a first feature amount which is the device feature amount or the measurement feature amount; and a presumption step of presuming the electrical device being in operation using the corrected first feature amount, and a second feature amount which is the device feature amount or the measurement feature amount, and a different feature amount from the first feature amount.

According to still another aspect of the present invention, there is provided a monitoring method performed by a computer that stores in advance a device feature amount which is a feature amount of each of a plurality of electrical devices installed in a predetermined unit in operation, the method including: a measured data acquisition step of acquiring measured data of the predetermined unit which is at least one of a total current consumption, a total power consumption, and a voltage measured in the predetermined unit; a feature amount extraction step of acquiring a measurement feature amount which is the feature amount included in the measured data of the predetermined unit; a first correction step of correcting the device feature amount; a second correction step that correcting the measurement feature amount; and a presumption step of presuming the electrical device being in operation using the corrected device feature amount and the corrected measurement feature amount.

According to still another aspect of the present invention, there is provided a monitoring method performed by a computer that stores in advance a device feature amount which is a feature amount of each of a plurality of electrical devices installed in a predetermined unit in operation, the method including: a measured data acquisition step of acquiring measured data of the predetermined unit which is at least one of a total current consumption, a total power consumption, and a voltage measured in the predetermined unit; a correction step of correcting the measured data of the predetermined unit; a feature amount extraction step of acquiring a corrected measurement feature amount which is the feature amount included in the corrected measured data of the predetermined unit; and a presumption step of presuming the electrical device being in operation using the device feature amount and the corrected measurement feature amount.

According to still another aspect of the present invention, there is provided a monitoring method performed by a computer that stores in advance reference data which is at least one of a current consumption, a power consumption, and a voltage measured using each of a plurality of electrical devices installed in a predetermined unit, placed in a different environment from the predetermined unit, the method including: a correction step of correcting the reference data of each of the plurality of electrical devices; a corrected device feature amount generation step of acquiring a corrected device feature amount which is a feature amount of each of the electrical devices included in each piece of the corrected reference data; a measured data acquisition step of acquiring measured data of the predetermined unit which is at least one of the total current consumption, the total power consumption, and the voltage measured in the predetermined unit; a feature amount extraction step of acquiring a measurement feature amount which is the feature amount included in the measured data of the predetermined unit; and a presumption step of presuming the electrical device being in operation using the corrected device feature amount and the measurement feature amount.

According to still another aspect of the present invention, there is provided a monitoring method performed by a computer that stores reference data which is at least one of a current consumption, a power consumption, and a voltage measured using each of a plurality of electrical devices installed in a predetermined unit, placed in a different environment from the predetermined unit; a first correction step of correcting the reference data of each of the plurality of electrical devices; a corrected device feature amount generation step of acquiring a corrected device feature amount which is a feature amount of each of the electrical devices included in each piece of the corrected reference data; a measured data acquisition step of acquiring measured data of the predetermined unit which is at least one of the total current consumption, the total power consumption, and the voltage measured in the predetermined unit; a second correction step of correcting the measured data of the predetermined unit; a feature amount extraction step of acquiring a corrected measurement feature amount which is the feature amount included in the corrected measured data of the predetermined unit; and a presumption step of presuming the electrical device being in operation using the corrected device feature amount and the corrected measurement feature amount.

According to still another aspect of the present invention, there is provided a program causing a computer to function as: a feature amount storage unit that stores a device feature amount which is a feature amount of each of a plurality of electrical devices installed in a predetermined unit in operation; a measured data acquisition unit that acquires measured data of the predetermined unit which is at least one of a total current consumption, a total power consumption, and a voltage measured in the predetermined unit; a feature amount extraction unit that acquires a measurement feature amount which is the feature amount included in the measured data of the predetermined unit; a correction unit that corrects a first feature amount which is the device feature amount or the measurement feature amount; and a presumption unit that presumes the electrical device being in operation using the corrected first feature amount, and a second feature amount which is the device feature amount or the measurement feature amount, and a different feature amount from the first feature amount.

According to still another aspect of the present invention, there is provided a program causing a computer to function as: a feature amount storage unit that stores a device feature amount which is a feature amount of each of a plurality of electrical devices installed in a predetermined unit in operation; a measured data acquisition unit that acquires measured data of the predetermined unit which is at least one of a total current consumption, a total power consumption, and a voltage measured in the predetermined unit; a feature amount extraction unit that acquires a measurement feature amount which is the feature amount included in the measured data of the predetermined unit; a first correction unit that corrects the device feature amount; a second correction unit that corrects the measurement feature amount; and a presumption unit that presumes the electrical device being in operation using the corrected device feature amount and the corrected measurement feature amount.

According to still another aspect of the present invention, there is provided a program causing a computer to function as: a feature amount storage unit that stores a device feature amount which is a feature amount of each of a plurality of electrical devices installed in a predetermined unit in operation; a measured data acquisition unit that acquires measured data of the predetermined unit which is at least one of a total current consumption, a total power consumption, and a voltage measured in the predetermined unit; a correction unit that corrects the measured data of the predetermined unit; a feature amount extraction unit that acquires a corrected measurement feature amount which is the feature amount included in the corrected measured data of the predetermined unit; and a presumption unit that presumes the electrical device being in operation using the device feature amount and the corrected measurement feature amount.

According to still another aspect of the present invention, there is provided a program causing a computer to function as: a reference data storage unit that stores reference data which is at least one of a current consumption, a power consumption, and a voltage measured using each of a plurality of electrical devices installed in a predetermined unit, placed in a different environment from the predetermined unit; a correction unit that corrects the reference data of each of the plurality of electrical devices; a corrected device feature amount generation unit that acquires a corrected device feature amount which is a feature amount of each of the electrical devices included in each piece of the corrected reference data; a measured data acquisition unit that acquires measured data of the predetermined unit which is at least one of the total current consumption, the total power consumption, and the voltage measured in the predetermined unit; a feature amount extraction unit that acquires a measurement feature amount which is the feature amount included in the measured data of the predetermined unit; and a presumption unit that presumes the electrical device being in operation using the corrected device feature amount and the measurement feature amount.

According to still another aspect of the present invention, there is provided a program causing a computer to function as: a reference data storage unit that stores reference data which is at least one of a current consumption, a power consumption, and a voltage measured using each of a plurality of electrical devices installed in a predetermined unit, placed in a different environment from the predetermined unit; a first correction unit that corrects the reference data of each of the plurality of electrical devices; a corrected device feature amount generation unit that acquires a corrected device feature amount which is a feature amount of each of the electrical devices included in each piece of the corrected reference data; a measured data acquisition unit that acquires measured data of the predetermined unit which is at least one of the total current consumption, the total power consumption, and the voltage measured in the predetermined unit; a second correction unit that corrects the measured data of the predetermined unit; a feature amount extraction unit that acquires a corrected measurement feature amount which is the feature amount included in the corrected measured data of the predetermined unit; and a presumption unit that presumes the electrical device being in operation using the corrected device feature amount and the corrected measurement feature amount.

According to still another aspect of the present invention, there is provided a correction information generation device including: a unit that acquires measured data of the predetermined unit which is at least one of a total current consumption, a total power consumption, and a voltage of an electrical device measured in a first environment; a unit that acquires reference data which is at least one of a total current consumption, a total power consumption, and a voltage of the electrical device measured in a second environment different from the first environment; and a unit that generates correction information for cancelling a difference between the measured data of the predetermined unit and the reference data based on the measured data of the predetermined unit and the reference data.

According to still another aspect of the present invention, there is provided a correction information generation device including: a unit that acquires measured data of the predetermined unit which is at least one of a total current consumption, a total power consumption, and a voltage of an electrical device measured in a first environment; a unit that acquires a measurement feature amount which is a feature amount included in the measured data of the predetermined unit; a unit that acquires reference data which is at least one of a total current consumption, a total power consumption, and a voltage of the electrical device measured in a second environment different from the first environment; a unit that acquires a device feature amount which is a feature amount included in the reference data; and a unit that generates correction information for cancelling a difference between the device feature amount and the measurement feature amount based on the device feature amount and the measurement feature amount.

According to still another aspect of the present invention, there is provided a program causing a computer to function as: a unit that acquires measured data of the predetermined unit which is at least one of a total current consumption, a total power consumption, and a voltage of an electrical device measured in a first environment; a unit that acquires reference data which is at least one of a total current consumption, a total power consumption, and a voltage of the electrical device measured in a second environment different from the first environment; and a unit that generates correction information for cancelling a difference between the measured data of the predetermined unit and the reference data based on the measured data of the predetermined unit and the reference data.

According to still another aspect of the present invention, there is provided a program causing a computer to function as: a unit that acquires measured data of the predetermined unit which is at least one of a total current consumption, a total power consumption, and a voltage of an electrical device measured in a first environment; a unit that acquires a measurement feature amount which is a feature amount included in the measured data of the predetermined unit; a unit that acquires reference data which is at least one of a total current consumption, a total power consumption, and a voltage of the electrical device measured in a second environment different from the first environment; a unit that acquires a device feature amount which is a feature amount included in the reference data; and a unit that generates correction information for cancelling a difference between the device feature amount and the measurement feature amount based on the device feature amount and the measurement feature amount.

According to still another aspect of the present invention, there is provided a correction information generation method performed by a computer, the method including: a step of acquiring measured data of the predetermined unit which is at least one of a total current consumption, a total power consumption, and a voltage of an electrical device measured in a first environment; a step of acquiring reference data which is at least one of a total current consumption, a total power consumption, and a voltage of the electrical device measured in a second environment different from the first environment; and a step of generating correction information for cancelling a difference between the measured data of the predetermined unit and the reference data based on the measured data of the predetermined unit and the reference data.

According to still another aspect of the present invention, there is provided a correction information generation method performed by a computer, the method including: a step of acquiring measured data of the predetermined unit which is at least one of a total current consumption, a total power consumption, and a voltage of an electrical device measured in a first environment; a step of acquiring a measurement feature amount which is a feature amount included in the measured data of the predetermined unit; a step of acquiring reference data which is at least one of a total current consumption, a total power consumption, and a voltage of the electrical device measured in a second environment different from the first environment; a step of acquiring a device feature amount which is a feature amount included in the reference data; and a step of generating correction information for cancelling a difference between the device feature amount and the measurement feature amount based on the device feature amount and the measurement feature amount.

Advantageous Effects of Invention

The present invention realizes a technology for reducing a disadvantage of deterioration in precision of a presumption process of presuming an electrical device being in operation in a technology for generating a reference feature amount of each electrical device using measured data (for example, a current consumption, a power consumption, or a voltage) measured when the same kind of electrical device as the electrical device installed in a predetermined unit (for example, each household, a specific room in a certain household, or each office) is placed in another location (for example, a research room or a laboratory room).

BRIEF DESCRIPTION OF THE DRAWINGS

The above-described objects, other objects, features, and advantages will be apparent throughout preferred exemplary embodiments to be described below and the following drawings appended to the exemplary embodiments.

DESCRIPTION OF EXEMPLARY EMBODIMENTS

Hereinafter, a hardware configuration of a monitoring device according to a present exemplary embodiment will be described. Each unit included in the monitoring device according to the exemplary embodiment is configured by any combination of hardware and software on the basis of a central processing unit (CPU), a memory, a program loaded on the memory (also including a program which is stored in the memory in advance when shipping out the device and a program which is downloaded from a storage medium such as a compact disc (CD), or a server or the like on the Internet) of any computer, a storage unit such as a hard disk which stores the program, and an interface for network connection. In addition, those skilled in the art can understand that various modifications can be made to examples for realizing the method and device.

Figure 1:
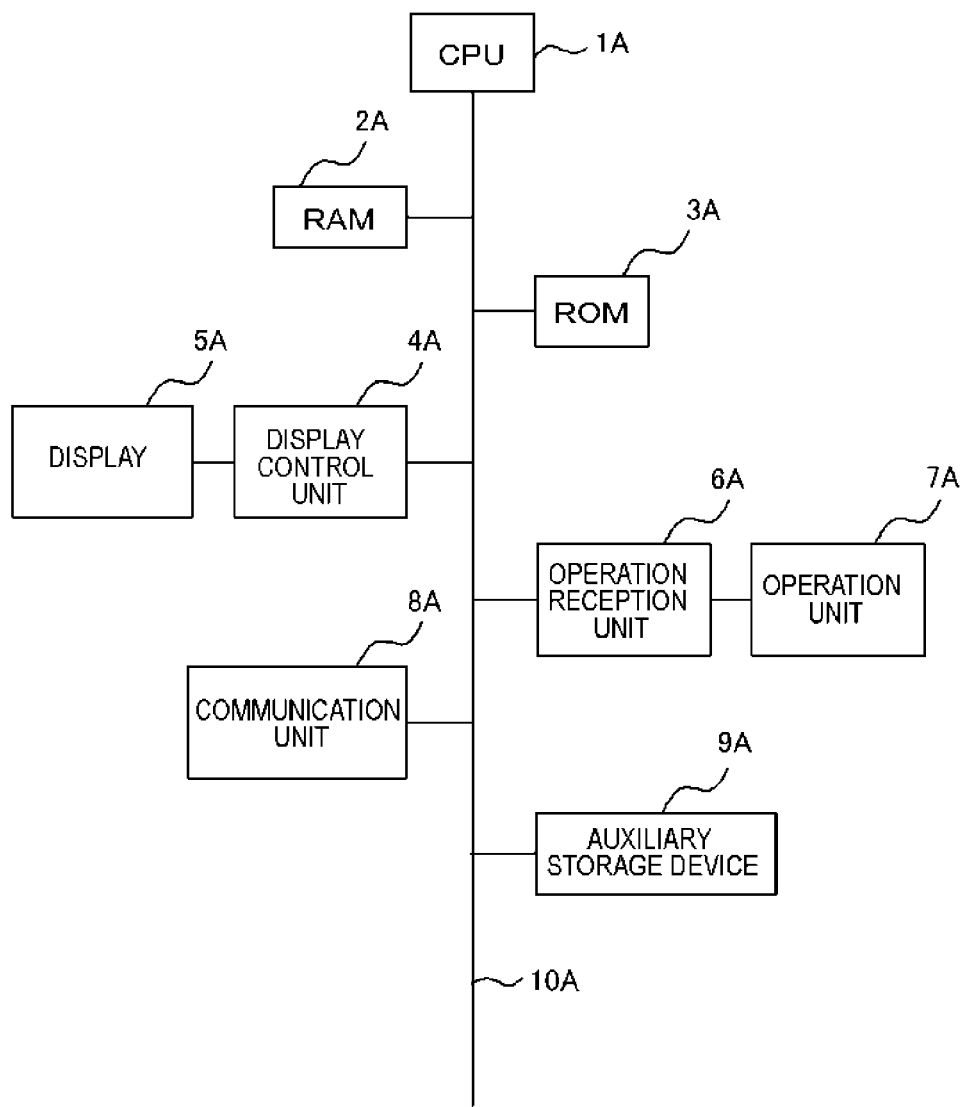
FIG. 1 is a diagram conceptually illustrating an example of a hardware configuration of a monitoring device according to a present exemplary embodiment.

FIG. 1 is a diagram conceptually illustrating an example of the hardware configuration of the monitoring device according to the present exemplary embodiment. As illustrated, the monitoring device according to the present exemplary embodiment includes, for example, a CPU 1A, a random access memory (RAM) 2A, a read-only memory (ROM) 3A, a display control unit 4A, a touch panel display 5A, an operation reception unit 6A, an operation unit 7A, a communication unit 8A, and an auxiliary storage device 9A connected to each other via a bus 10A. Although not illustrated, the monitoring device may additionally include other elements such as input and output interfaces connected to external devices in a wired manner, a microphone, and a speaker.

The CPU 1A controls each element and an entire computer of the monitoring device. The ROM 3A includes areas which store a program causing a computer to operate or various application program and various kinds of setting data used when such a program operates. The RAM 2A includes an area which temporarily stores data, such as a work area in which a program operate. The auxiliary storage device 9A is, for example, a hard disk drive (HDD) and can store large-volume data.

In the touch panel display 5A, a display device (for example, a light emitting diode (LED) display, a liquid crystal display, or an organic electroluminescence (EL) display) and a touch panel are integrated. The display control unit 4A reads data stored in a video RAM (VRAM), performs a predetermined process on the read data, and then transmits the data to the touch panel display 5A to display various screens. The operation reception unit 6A receives various operations through the operation unit 7A. The operation unit 7A includes an operation key, an operation button, a switch, a jog dial, a touch panel display, and a keyboard. The communication unit 8A is connected to a network such as the Internet or a local area network (LAN) in a wired and/or wireless manner to communicate with other electrical device.

Hereinafter, the present exemplary embodiment will be described. Functional block diagrams used to describe the following exemplary embodiment illustrate blocks in units of functions rather than configurations in units of hardware. In the drawings, each device is configured by a single device in the description, but configuration methods are not limited thereto. That is, each device may be configured to be physically divided or logically divided. The same reference numerals are given to the same constituent elements and the description thereof will not be repeated.

<First Exemplary Embodiment>

First, an overview of the present exemplary embodiment will be described. A monitoring device according to the present exemplary embodiment compares feature amounts obtained by combining prepared feature amounts (reference feature amounts) of a plurality of electrical devices to, for example, a feature amount (measurement feature amount) extracted from measured data such as a total current consumption, a total power consumption, or a voltage in a predetermined unit (for example, each household, a specific room of a certain household, or each office) measured in a distribution board, and thus presumes the operation states of the electrical devices. In the present exemplary embodiment, the reference feature amount of each electrical device is generated using measured data (for example, a current consumption, a power consumption, or a voltage) measured when the same kind of electrical device as an electrical device installed in a predetermined unit (for example, each household, a specific room in a certain household, or each office) is placed in another location (for example, a research room or a laboratory room).

In the present exemplary embodiment, when the operation state of the electrical device is presumed, the measurement feature amount extracted from the measured data measured in the predetermined unit is first corrected to a value considered to be obtained when the electrical device is placed and measured in the other location (for example, a research room or a laboratory room) in consideration of a difference in an environment between the predetermined unit and the other location (for example, a research room or a laboratory room). Then, the operation state of the electrical device is presumed using the corrected measurement feature amount and the reference feature amount.

Figure 2:
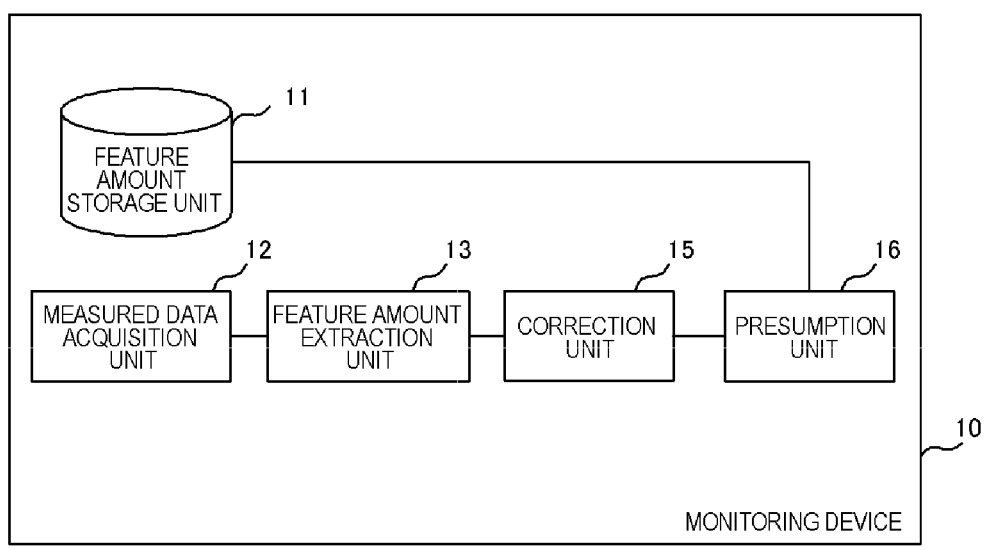
FIG. 2 is a diagram illustrating an example of a functional block diagram of the monitoring device according to the present exemplary embodiment.

Next, a configuration according to the present exemplary embodiment will be described. FIG. 2 illustrates an example of a functional block diagram of a monitoring device 10 according to the present exemplary embodiment. As illustrated, the monitoring device 10 according to the present exemplary embodiment includes a feature amount storage unit 11, a measured data acquisition unit 12, a feature amount extraction unit 13, a correction unit 15, and a presumption unit 16.

The feature amount storage unit 11 stores a device feature amount (reference feature amount) which is a feature amount of each of a plurality of electrical devices installed in a predetermined unit in operation in association with identification information of each electrical device. The feature amount storage unit 11 may store a feature amount at the time of power-on of each electrical device or may store a feature amount for each operation state of each electrical device, for example, a feature amount for each power consumption value (for example, a feature amount when the power consumption is greater than 0 W and equal to or less than A W or a feature amount when the power consumption is greater than A W and equal to or less than B W) in association with the identification information.

The predetermined unit is a unit in which the operation state of the electrical device is presumed. That is, the monitoring device 10 according to the present exemplary embodiment can presume whether each electrical device installed in the predetermined unit is operating. As the predetermined unit, it is sufficient if measured data including at least one of a total current consumption (instantaneous value), a total power consumption (instantaneous value), and a voltage (instantaneous value) in at least the predetermined unit is measurable. For example, the predetermined unit may be, for example, one household, one store, one company, one building in which a plurality of households, a plurality of stores, a plurality of companies, or the like are present, or one community in which a plurality of households gather. Similarly, a collection for each branch of a distribution board installed in a household or a store, one socket, or one table tap may also be set as the predetermined unit.

The device feature amount (reference feature amount) stored by the feature amount storage unit 11 is a feature amount which can be extracted from the measured data including at least one of a current consumption (instantaneous value), a power consumption (instantaneous value), and a voltage (instantaneous value) measured at the time of the operation of each electrical device. For example, the device feature amount may also be a frequency intensity and phase (harmonic component) of a current consumption, a phase, a change in a current consumption, an average value, a peak value, an effective value, a peak-to-rms ratio, a form factor, a convergence time of a current change, an energization time, the position of a peak, a time difference between a peak position of a voltage and a peak position of a current consumption, or a phase factor. Of course, the present invention is not limited to these examples.

Such a device feature amount is a feature amount extracted from the reference data which is at least one of a current consumption, a power consumption, and a voltage measured when each of the plurality of electrical devices installed in the predetermined unit is placed in a different environment from the predetermined unit.

Here, an example of a process of generating such a device feature amount and storing the device feature amount in the feature amount storage unit 11 will be described. For example, a service provider that provides a service for visualizing operation states of electrical devices using the monitoring device 10 measures each piece of the reference data of each electrical device in an management area (for example, a research room or a laboratory room) of the service provider. A manufacturer of an electrical device may measure the reference data of each electrical device of the manufacturer in a management area (for example, a research room or a laboratory room) of the manufacturer. The service provider may acquire the reference data from the manufacturer. The service provider can generate a database in which the reference data obtained in this way is associated with identification information of each electrical device (hereinafter referred to as a "reference data database").

The service provider may extract a feature amount (device feature amount) from the reference data obtained in this way and generate a database in which each of the device feature amounts of the electrical devices matches the identification information of each of the plurality of electrical devices (hereinafter referred to as a "device feature amount database"). When the service provider comprehends kinds of electrical devices installed in the predetermined unit, the service provider extracts the device feature amounts of the electrical devices from the device feature amount database and stores the device feature amounts in the feature amount storage unit 11. The series of processes may be realized through computer processing.

In a case in which the device feature amount of an electrical device installed in the predetermined unit is not present in the device feature amount database, the service provider can perform a process of acquiring the reference data of the electrical device and adding the reference data to the reference data database and a process of extracting the device feature amount from the newly acquired reference data and adding the device feature amount to the device feature amount database every time. In this way, the service provider can expand the reference data database and the device feature amount database.

The service provider may manage, for example, measurement conditions at the time of measurement of the reference data of each electrical device in the device feature amount database or the reference data database. The measurement conditions include all of the factors which can have an influence on measurement results (measured values). For example, the length of an interconnect between a measuring instrument and an electrical device, the number or lengths of interconnects branched from the interconnect, the number or kinds of other electrical devices connected to the interconnects, a length from a distribution board to an electrical device, identification information (item number, a lot number, or the like) of the measuring instrument, information regarding a unique measurement error potentially included immediately after manufacturing of the measuring instrument, and information regarding a place in which the measurement is performed (for example, whether a transformer, an electrical substation, a large-scale power consumption facility is present nearby, or a distance to the transformer, the electrical substation, or the large-scale power consumption facility) are considered. The information regarding a unique measurement error to the measuring instrument may be, for example, information which is provided by a manufacturer of the measuring instrument.

The measured data acquisition unit 12 acquires measured data (hereinafter referred to as "measured data of a predetermined unit") which is at least one of the total current consumption (instantaneous value), the total power consumption (instantaneous value), and the voltage (instantaneous value) measured in the predetermined unit. For example, the measured data acquisition unit 12 acquires the measured data of the predetermined unit measured by the measuring instrument installed corresponding to a power-feeding service entrance, a distribution board, a socket, or a table tap through a communication cable connecting the monitoring device 10 to the measuring instrument, a network such as the Internet or a LAN, or the like. In a case in which a plurality of measuring instruments are installed in one predetermined unit (for example, a case in which one community in which a plurality of households gather is the predetermined unit), the measured data acquisition unit 12 can acquire the measured data of the predetermined unit of the unit (the community) by adding the pieces of measured data measured by the plurality of measuring instruments (for example, measuring instruments installed near distribution boards of the households) according to a time (synchronously).

The feature amount extraction unit 13 extracts the measurement feature amount which is a feature amount included in the measured data of the predetermined unit from the measured data of the predetermined unit acquired by the measured data acquisition unit 12. The measurement feature amount is the same kind of feature amount as the device feature amount stored by the feature amount storage unit 11.

The correction unit 15 corrects the measurement feature amount extracted by the feature amount extraction unit 13 based on unit feature information indicating a feature of the predetermined unit. That is, the correction unit 15 corrects the measurement feature amount in a direction in which a difference occurring between the measurement feature amount and the device feature amount due to disagreement between a measurement condition at the time of measurement of the reference data for extracting the device feature amount and a measurement condition (a condition specified by the unit feature information of the predetermined unit) at the time of measurement of the measured data of the predetermined unit for extracting the measurement feature amount is cancelled.

The unit feature information includes all of the factors which can have an influence on the measurement results (measured values) when the measured data of the predetermined unit of the electrical devices is measured with the measuring instrument installed in the predetermined unit. As the unit feature information, for example, information regarding an interconnect in the predetermined unit, specifically, the length of an interconnect between the measuring instrument and the electrical device, the length of an interconnect from a distribution board to each socket to which each electrical device is connected, the number of branches from the distribution board, the length of a cable included in each electrical device, whether there is an extension cord between the socket and each electrical device, and the length of the extension cord in a case in which there is the extension cord, are considered. Additionally, as the unit feature information, information for specifying an electrical device connected to an interconnect in the predetermined unit, for example, information for specifying the electrical devices connected to the same branch and connected to each other through an interconnect (for example, the number or kinds of electrical devices), is considered. Further, as the unit feature information, identification information (item number, a lot number, or the like) of the measuring instrument, information regarding a unique measurement error potentially included immediately after manufacturing of the measuring instrument, and information regarding an environment near the predetermined unit (for example, whether a transformer, an electrical substation, a large-scale power consumption facility is present nearby, or a distance to the transformer, the electrical substation, or the large-scale power consumption facility) are considered.

For example, the service provider that provides a service for visualizing operation states of electrical devices using the monitoring device 10 acquires the unit feature information as preparation to start providing the service from the service receiver. Then, the service provider generates correction information used for the correction unit 15 to correct the measurement feature amount, for example, a transfer function (a transfer function of outputting the corrected measurement feature amount when the measurement feature amount is input), in consideration of the acquired unit feature information, the measurement condition at the time of measurement of the reference data, and the like and retains the correction information in the correction unit 15. For example, by setting an interconnect as an inductance and regarding an electrical device connected to the interconnect as an electrostatic capacitance, the correction information (for example, a transfer function) for specifying characteristics of a circuit as an LC circuit and to which the electrical device is connected at the time of measurement of the measured data of the predetermined unit and the reference data and cancelling a difference in the characteristics may also be generated. When the measurement feature amount is acquired from the unit feature information acquisition unit 14, the correction unit 15 inputs the measurement feature amount into, for example, the transfer function and obtains the corrected measurement feature amount.

The presumption unit 16 presumes the electrical device being in operation using the corrected measurement feature amount and the device feature amount. A presumption process by the presumption unit 16 can be realized in conformity to the technology of the related art. Hereinafter, an example of the presumption process will be described.

In a case in which one or more electrical devices are operating in the predetermined unit, the corrected measurement feature amount is a feature amount in which the device feature amounts (for example, a device feature amount at the time of one operation state) of one or more electrical devices are added. Accordingly, the presumption unit 16 compares one device feature amount (for example, a device feature amount at the time of one operation state) of one electrical device selected from the plurality of device feature amounts stored in the feature amount storage unit 11 or the feature amount obtained by adding the device feature amounts (a device feature amount at the time of one operation state) of the plurality of electrical devices to the corrected measurement feature amount and specifies a combination of the device feature amounts which are identical to the corrected measurement feature amount (which may conceptually include a predetermined error range). Then, the estimation unit 16 presumes the electrical device corresponding to the device feature amount included in the specified combination as the electrical device being in operation. Further, the operation state (for example, a power consumption) of each electrical device is presumed.

Figure 3:
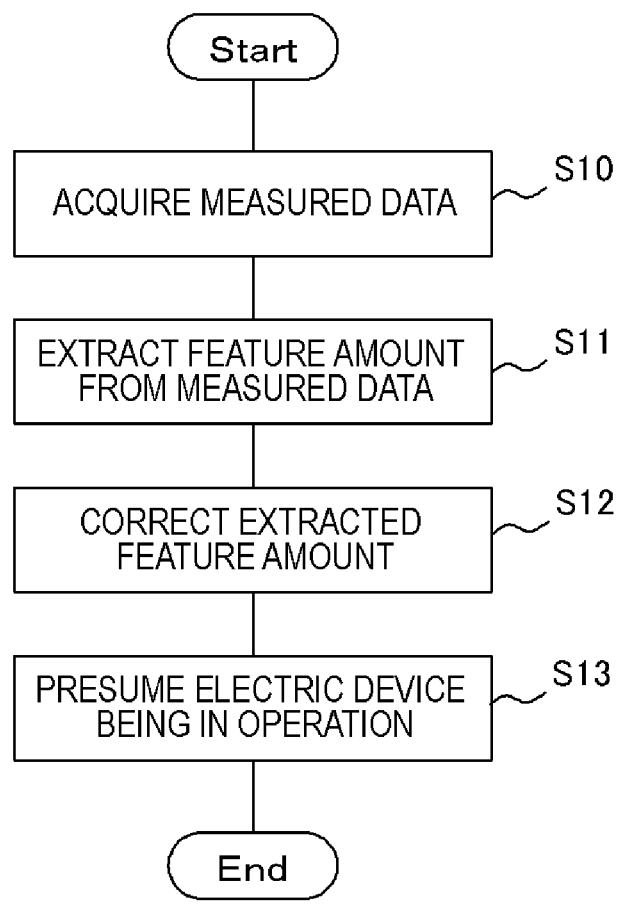
FIG. 3 is a flowchart illustrating an example of the flow of a process of the monitoring device according to the present exemplary embodiment.

Next, an example of the flow of a process of the monitoring device 10 according to the present exemplary embodiment will be described with reference to the flowchart of FIG. 3.

First, the service provider that provides a service for visualizing operation states of electrical devices using the monitoring device 10 acquires information for specifying the electrical devices installed in the predetermined unit and the unit feature information indicating the feature of the predetermined unit as preparation to start providing the service from a service receiver. The service provider extracts, for example, a predetermined device feature amount from the device feature amount database based on the acquired information for specifying the electrical devices installed in the predetermined unit and stores the predetermined device feature amount in the feature amount storage unit 11. Then, the service provider generates correction information used for the correction unit 15 to correct the measurement feature amount, for example, a transfer function (a transfer function of outputting the corrected measurement feature amount when the measurement feature amount is input), in consideration of the acquired unit feature information, the measurement condition at the time of measurement of the reference data, and the like and retains the correction information in the correction unit 15.

In S10, the measured data acquisition unit 12 acquires the measured data of the predetermined unit which is at least one of a total current consumption, a total power consumption, and a voltage measured in the predetermined unit. For example, the measured data acquisition unit 12 acquires the measured data of the predetermined unit measured by the measuring instrument installed near a power-feeding service entrance, a distribution board, or the like through a communication cable connecting the monitoring device 10 to the measuring instrument, a network such as the Internet or a LAN, or the like.

In S11, the feature amount extraction unit 13 extracts the measurement feature amount included in the measured data of the predetermined unit from the measured data of the predetermined unit acquired in S10. In S12, the correction unit 15 inputs the measurement feature amount acquired in S11 by the feature amount extraction unit 13 into the correction information (for example, transfer function) retained in advance and obtains an output as the corrected measurement feature amount.

In S13, the presumption unit 16 presumes the electrical device being in operation using the device feature amount stored in the feature amount storage unit 11 and the corrected measurement feature amount corrected in S15 by the correction unit 15.

Figure 4:
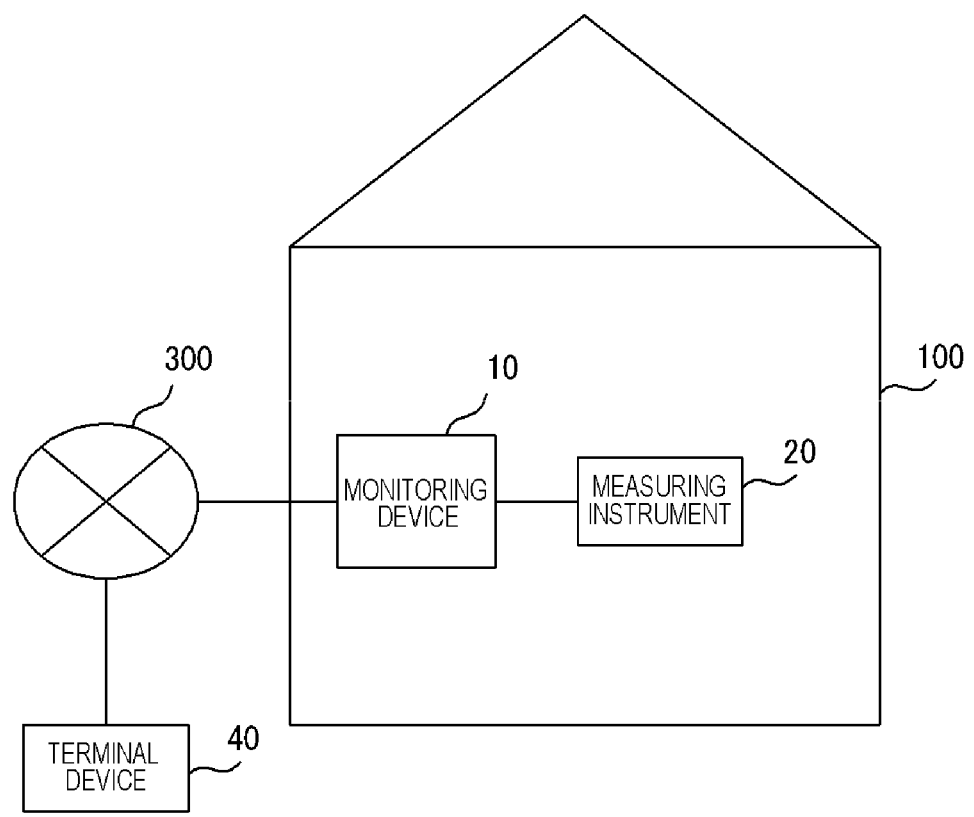
FIG. 4 is a conceptual diagram illustrating an application example of the monitoring device according to the present exemplary embodiment.

Next, an application example of the monitoring device 10 according to the present exemplary embodiment will be described with reference to FIGS. 4 and 5. In an example of FIG. 4, the monitoring device 10 is installed in an area 100 of a service receiver that receives a service for visualizing operation states of electrical devices using the monitoring device 10 in each household, each company, or the like. The monitoring device 10 is connected to a measuring instrument 20 that measures the measured data of the predetermined unit in the predetermined unit through a communication cable, a network such as a LAN, or the like. The measuring instrument 20 is installed near a power-feeding service entrance, a distribution board, or the like. The measured data acquisition unit 12 of the monitoring device 10 acquires the measured data of the predetermined unit from the measuring instrument 20. Transmission of the measured data of the predetermined unit from the measuring instrument 20 to the monitoring device 10 may be a real-time process or a batch process.

The monitoring device 10 can include an output device such as a display or a speaker. Then, the monitoring device 10 can output a result presumed by the presumption unit 16 through the output device. The monitoring device 10 may presume the electrical device (and the operation state) being in operation at that time in real time and output the presumption result, or may output the presumption result obtained by visualizing a temporal change of the operation state of the electrical device (for example, a time-series graph indicating details of an ON/OFF state and/or an operation state at each time of each of the plurality of electrical devices, a time-series graph indicating a kind of electrical device being in operation at each time, or the like) in a predetermined time period (for example, from 00:00 to 24:00) at a predetermined timing. The monitoring device 10 may transmits the presumption result to a terminal device (a portable terminal or the like) 40 of the service receiver through a network 300.

Figure 5:
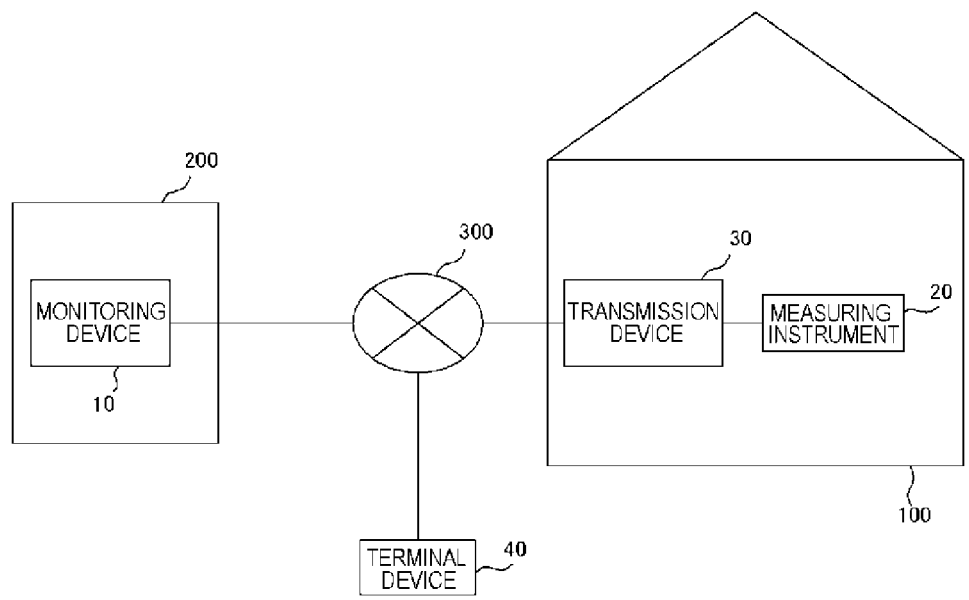
FIG. 5 is a conceptual diagram illustrating an application example of the monitoring device according to the present exemplary embodiment.

In an example of FIG. 5, the monitoring device 10 is installed in an area 200 of a service provider that provides a service for visualizing operation states of electrical devices using the monitoring device 10. A transmission device 30 is installed in an area 100 of a service receiver that receives the service for visualizing the operation states of the electrical devices using the monitoring device 10, such as each household or each company. The transmission device 30 is connected to a measuring instrument 20 that measures the measured data of the predetermined unit in the predetermined unit through a communication cable, a network such as a LAN, or the like. The transmission device 30 acquires the measured data of the predetermined unit from the measuring instrument 20. Then, the transmission device 30 transmits the acquired measured data of the predetermined unit to the monitoring device 10 installed in an area 200 of the service provider through a network 300. A process of acquiring the measured data of the predetermined unit from the measuring instrument 20 by transmission device 30 and transmitting the measured data of the predetermined unit to the monitoring device 10 may be a real-time process or a batch process.

The monitoring device 10 transmits a result presumed by the presumption unit 16 to the transmission device 30 or the terminal device 40. The transmission device 30 or the terminal device 40 outputs the received presumption result through an output device such as a display or a speaker. The monitoring device 10 may presume the electrical device (and the operation state) being in operation at that time in real time and transmit the presumption result to the transmission device 30 or the terminal device 40, or may transmit the presumption result obtained by visualizing a temporal change of the operation state of the electrical device (for example, a time-series graph indicating details of an ON/OFF state and/or an operation state at each time of each of the plurality of electrical devices, a time-series graph indicating a kind of electrical device being in operation at each time, or the like) in a predetermined time period (for example, from 00:00 to 24:00) at a predetermined timing to the transmission device 30 or the terminal device 40.

Next, operation and effect of the present exemplary embodiment will be described. The monitoring device 10 according to the present exemplary embodiment generates the device feature amount (the reference feature amount) of each electrical device using the reference data (for example, a current consumption, a power consumption, and a voltage) measured when the same kind of electrical device as an electrical device installed in a predetermined unit (for example, each household, a specific room in a certain household, or each office) is placed in another location (for example, a research room or a laboratory room). The process of presuming the electrical device being in operation is performed using the device feature amount generated in this way. In the case of the present exemplary embodiment, it is not necessary to perform the measurement to generate the device feature amount in each predetermined unit. Therefore, an unnecessary burden of generating the device feature amount is not imposed on the service receiver.

In such a configuration, the device feature amount of a first electrical device and the feature amount (measurement feature amount) of the first electrical device indicated in the reference data measured in the predetermined unit may be different values. As a result, the precision of the process of presuming the electrical device being in operation may deteriorate.

To reduce the disadvantage, the monitoring device 10 according to the present exemplary embodiment corrects the measurement feature amount in a direction in which a difference occurring between the measurement feature amount and the device feature amount due to disagreement between a measurement condition at the time of measurement of the reference data for extracting the device feature amount and a measurement condition (a condition specified by the unit feature information of the predetermined unit) at the time of measurement of the measured data of the predetermined unit for extracting the measurement feature amount is cancelled, and then performs the process of presuming the electrical device being in operation using the corrected measurement feature amount and the device feature amount. Therefore, it is possible to presume the electrical device being in operation with high precision.

<Second Exemplary Embodiment>

In the first exemplary embodiment, the "measurement feature amount" has been corrected in the direction in which the difference occurring between the measurement feature amount and the device feature amount due to disagreement between a measurement condition at the time of measurement of the reference data for extracting the device feature amount and the measurement condition (the condition specified by the unit feature information of the predetermined unit) at the time of measurement of the measured data of the predetermined unit for extracting the measurement feature amount is cancelled. In contrast, in a present exemplary embodiment, a "device feature amount" is corrected in a direction in which a difference between a measurement feature amount and the device feature amount is cancelled.

Figure 6:
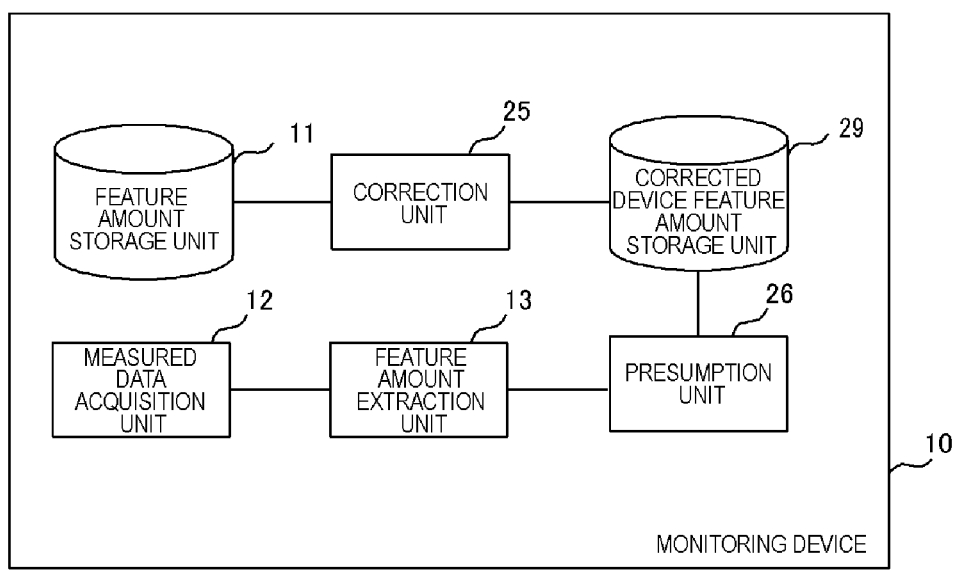
FIG. 6 is a diagram illustrating an example of a functional block diagram of the monitoring device according to the present exemplary embodiment.

FIG. 6 illustrates an example of a functional block diagram of a monitoring device 10 according to the present exemplary embodiment. As illustrated, the monitoring device 10 according to the present exemplary embodiment includes a feature amount storage unit 11, a measured data acquisition unit 12, a feature amount extraction unit 13, a correction unit 25, a presumption unit 26, and a corrected device feature amount storage unit 29. The configurations of the feature amount storage unit 11, the measured data acquisition unit 12, and the feature amount extraction unit 13 are the same as those of the first exemplary embodiment, and thus the description thereof will not be repeated.

The correction unit 25 corrects the device feature amount stored in the feature amount storage unit 11 based on unit feature information indicating a feature of the predetermined unit. That is, the correction unit 15 corrects the device feature amount in a direction in which a difference occurring between the measurement feature amount and the device feature amount due to disagreement between a measurement condition at the time of measurement of the reference data for extracting the device feature amount and a measurement condition (a condition specified by the unit feature information of the predetermined unit) at the time of measurement of the measured data of the predetermined unit for extracting the measurement feature amount is cancelled. The correction of the device feature amount can be realized by the same unit as that of the correction of the measurement feature amount described in the first exemplary embodiment.

The corrected device feature amount storage unit 29 stores the corrected device feature amount corrected by the correction unit 25. Then, the presumption unit 26 presumes an electrical device being in operation using the measurement feature amount generated by the feature amount extraction unit 13 and the corrected device feature amount stored in the corrected device feature amount storage unit 29. The process of presuming the electrical device being in operation by the presumption unit 26 is the same as that of the first exemplary embodiment, and thus the description thereof will not be repeated herein.

Figure 7:
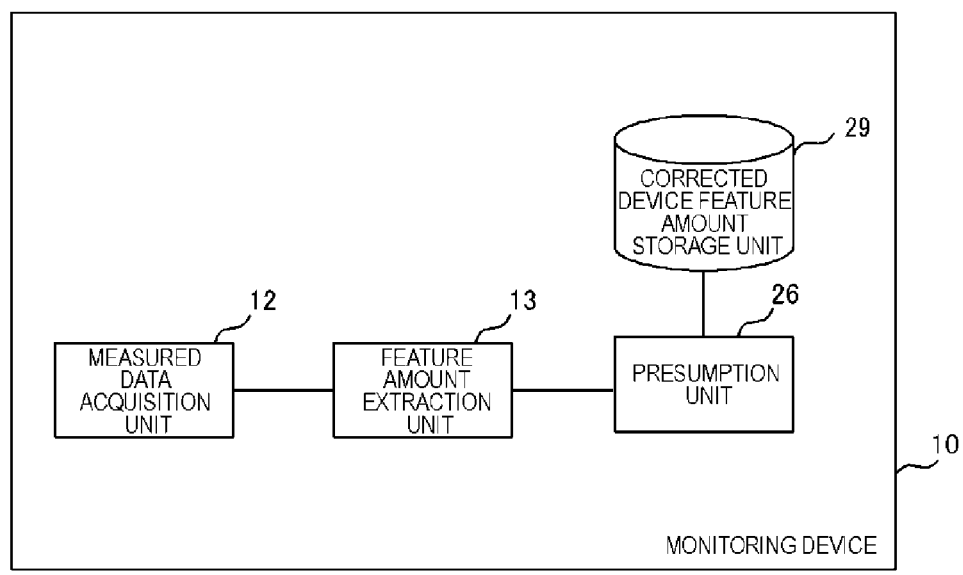
FIG. 7 is a diagram illustrating an example of a functional block diagram of the monitoring device according to the present exemplary embodiment.

FIG. 7 illustrates another example of a functional block diagram of the monitoring device 10 according to the present exemplary embodiment.

As illustrated, the monitoring device 10 according to the present exemplary embodiment includes the measured data acquisition unit 12, the feature amount extraction unit 13, the presumption unit 26, and the corrected device feature amount storage unit 29. Compared to the example of FIG. 6, whether the feature amount storage unit 11 and the correction unit 25 are included is different. In the case of the example of FIG. 7, the feature amount storage unit 11 and the correction unit 25 can be included in a different device from the monitoring device 10. The different device generates the corrected device feature amount, and the generated corrected device feature amount is stored in the corrected device feature amount storage unit 29 of the monitoring device 10.

An application example of the monitoring device 10 according to the present exemplary embodiment is the same as that of the first exemplary embodiment.

Figure 8:
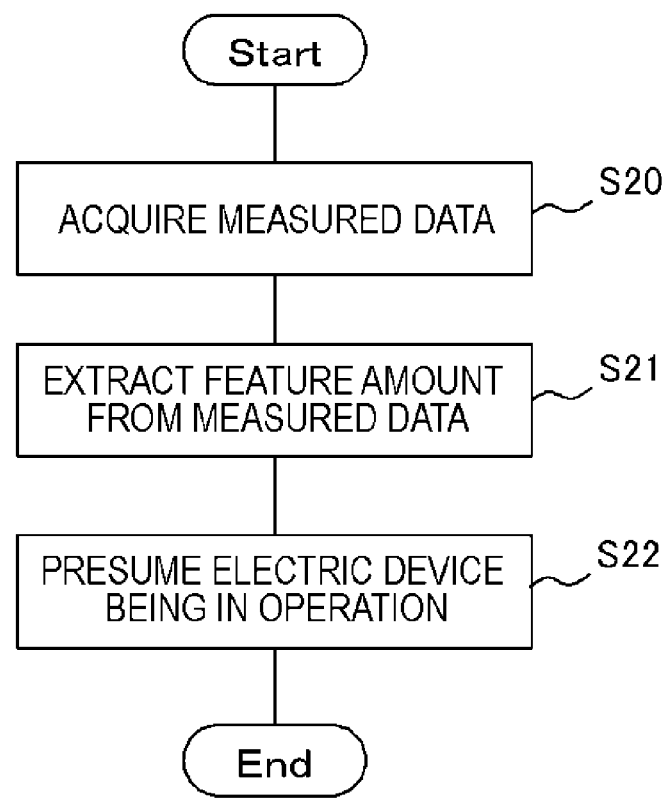
FIG. 8 is a flowchart illustrating an example of the flow of a process of the monitoring device according to the present exemplary embodiment.

Next, an example of the flow of a process of the monitoring device 10 according to the present exemplary embodiment will be described with reference to the flowchart of FIG. 8.

First, the service provider that provides a service for visualizing operation states of electrical devices using the monitoring device 10 acquires information for specifying the electrical devices installed in the predetermined unit and the unit feature information as preparation to start providing the service from a service receiver. The service provider extracts, for example, a predetermined device feature amount from the device feature amount database based on the acquired information for specifying the electrical devices installed in the predetermined unit and stores the predetermined device feature amount in the feature amount storage unit 11. Then, the service provider generates correction information used for the correction unit 25 to correct the device feature amount, for example, a transfer function (a transfer function of outputting the corrected device feature amount when the device feature amount is input), in consideration of the acquired unit feature information, the measurement condition at the time of measurement of the reference data, and the like and retains the correction information in the correction unit 25. Then, the correction unit 25 inputs the device feature amount stored in the feature amount storage unit 11 into, for example, the transfer function and obtains the corrected device feature amount as an output. The correction unit 25 stores the obtained corrected device feature amount in the corrected device feature amount storage unit 29.

In S20, the measured data acquisition unit 12 acquires the measured data of the predetermined unit which is at least one of a total current consumption, a total power consumption, and a voltage measured in the predetermined unit. For example, the measured data acquisition unit 12 acquires the measured data of the predetermined unit measured by the measuring instrument installed near a power-feeding service entrance, a distribution board, or the like through a communication cable connecting the monitoring device 10 to the measuring instrument, a network such as the Internet or a LAN, or the like.

In S21, the feature amount extraction unit 13 extracts the measurement feature amount included in the measured data of the predetermined unit from the measured data of the predetermined unit acquired in S20. In S22, the presumption unit 26 presumes the electrical device being in operation using the device feature amount stored in the corrected device feature amount storage unit 29 and the measurement feature amount acquired in S21 by the feature amount extraction unit 13.

According to the above-described present exemplary embodiment, it is possible to realize the same operation and effect as those of the first exemplary embodiment. Since the process of presuming the electrical device being in operation does not include the correction process by the correction unit 25, the presumption result can be calculated faster than in the first exemplary embodiment.

In the first and second exemplary embodiments, one of the measurement feature amount and the device feature amount has been corrected such that the difference occurring between the measurement feature amount and the device feature amount is cancelled. However, both of the measurement feature amount and the device feature amount may be corrected such that a difference occurring with a feature amount measured in a measurement condition (standard condition) serving as a predetermined standard is cancelled.

Figure 14:
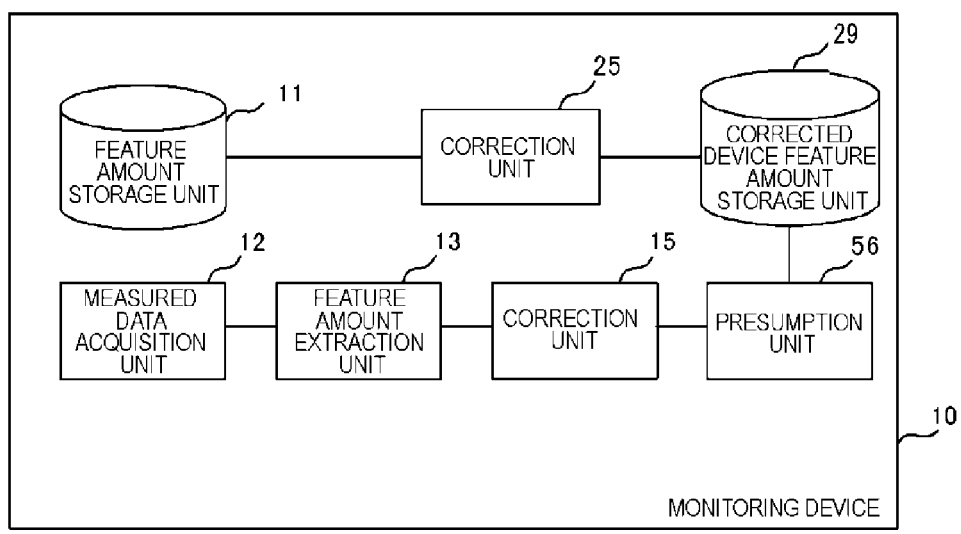
FIG. 14 is a diagram illustrating an example of a functional block diagram of a monitoring device according to a modification example of the present exemplary embodiment.

Specifically, a configuration according to a modification example of the present exemplary embodiment will be described. FIG. 14 illustrates an example of a functional block diagram of a monitoring device 10 according to the modification example of the present exemplary embodiment. As illustrated, the monitoring device 10 according to the present exemplary embodiment includes a feature amount storage unit 11, a measured data acquisition unit 12, a feature amount extraction unit 13, a correction unit (second correction unit) 15, a correction unit (first correction unit) 25, a corrected device feature amount storage unit 29, and a presumption unit 56.

The feature amount storage unit 11 stores a device feature amount (reference feature amount) which is a feature amount of each of a plurality of electrical devices installed in a predetermined unit in operation in association with identification information of each electrical device.

The predetermined unit is a unit in which the operation state of the electrical device is presumed. That is, the monitoring device 10 according to the modification example of the present exemplary embodiment can presume whether each electrical device installed in the predetermined unit is operating and presume an operation state of the electrical device. As the predetermined unit, it is sufficient if measured data of the predetermined unit including at least one of a total current consumption (instantaneous value), a total power consumption (instantaneous value), and a voltage (instantaneous value) in at least the predetermined unit is measurable. For example, the predetermined unit may be, for example, one household, one store, one company, one building in which a plurality of households, a plurality of stores, a plurality of companies, or the like are present, or one community in which a plurality of households gather. Similarly, a collection for each branch of a distribution board installed in a household or a store, one socket, or one table tap may also be set as the predetermined unit.

The device feature amount stored by the feature amount storage unit 11 is a feature amount which can be extracted from the measured data including at least one of a current consumption (instantaneous value), a power consumption (instantaneous value), and a voltage (instantaneous value) measured at the time of the operation of each electrical device. For example, the device feature amount may also be a frequency intensity phase (harmonic component) of a current consumption, a phase, a change in a current consumption, an average value, a peak value, an effective value, a peak-to-rms ratio, a form factor, a convergence time of a current change, an energization time, the position of a peak, a time difference between a peak position of a voltage and a peak position of a current consumption, or a phase factor. Of course, the present invention is not limited to these examples.

The device feature amount is a feature amount extracted from the reference data which is at least one of a current consumption, a power consumption, and a voltage measured when each of the plurality of electrical devices installed in the predetermined unit is placed in a different environment from the predetermined unit.

Here, an example of a process of generating such a device feature amount and storing the device feature amount in the feature amount storage unit 11 will be described. For example, a service provider that provides a service for visualizing operation states of electrical devices using the monitoring device 10 measures each piece of reference data of each electrical device in an management area (for example, a research room or a laboratory room) of the service provider. A manufacturer of an electrical device may measure the reference data of each electrical device of the manufacturer in a management area (for example, a research room or a laboratory room) of the manufacturer. The service provider may acquire the reference data from the manufacturer. The service provider can generate a database in which the reference data obtained in this way is associated with identification information of each electrical device (hereinafter referred to as a "reference data database").

The service provider can extract a feature amount (device feature amount) from the reference data obtained in this way and generate a database in which each of the device feature amounts of the electrical devices matches the identification information of each of the plurality of electrical devices (hereinafter referred to as a "device feature amount database"). When the service provider comprehends kinds of electrical devices installed in the predetermined unit, the service provider extracts the device feature amounts of the electrical devices from the device feature amount database and stores the device feature amounts in the feature amount storage unit 11. The series of processes may be realized through computer processing.

In a case in which the device feature amount of an electrical device installed in the predetermined unit is not present in the device feature amount database at all, the service provider can perform a process of acquiring the reference data of the electrical device and adding the reference data to the reference data database and a process of extracting the device feature amount from the newly acquired reference data and adding the device feature amount to the device feature amount database on all such occasions. In this way, the service provider can expand the reference data database and the device feature amount database.

The service provider may manage, for example, measurement conditions at the time of measurement of the reference data of each electrical device in the reference data database or the device feature amount database. The measurement conditions include all of the factors which can have an influence on measurement results (measured values). For example, the length of an interconnect between a measuring instrument and an electrical device, the number or lengths of interconnects branched from the interconnect, the number or kinds of other electrical devices connected to the interconnect, a length from a distribution board to an electrical device, identification information (item number, a lot number, or the like) of the measuring instrument, information regarding a unique measurement error potentially included immediately after manufacturing of the measuring instrument, and information regarding a place in which the measurement is performed (for example, whether a transformer, an electrical substation, a large-scale power consumption facility is present nearby, or a distance to the transformer, the electrical substation, or the large-scale power consumption facility) are considered. The information regarding a unique measurement error to the measuring instrument may be, for example, information which is provided by a manufacturer of the measuring instrument.

The measured data acquisition unit 12 acquires measured data of the predetermined unit which is at least one of the total current consumption (instantaneous value), the total power consumption (instantaneous value), and the voltage (instantaneous value) measured in the predetermined unit. For example, the measured data acquisition unit 12 acquires the measured data of the predetermined unit measured by the measuring instrument installed corresponding to a power-feeding service entrance, a distribution board, a socket, or a table tap through a communication cable connecting the monitoring device 10 to the measuring instrument, a network such as the Internet or a LAN, or the like. In a case in which a plurality of measuring instruments are installed in one predetermined unit (for example, a case in which one community in which a plurality of households gather is the predetermined unit), the measured data acquisition unit 12 can acquire the measured data of the predetermined unit of the unit (the community) by adding the pieces of measured data of the predetermined unit measured by the plurality of measuring instruments (for example, measuring instruments installed near distribution boards of the households) according to a time (synchronously).

The feature amount extraction unit 13 extracts the measurement feature amount which is a feature amount included in the measured data of the predetermined unit from the measured data of the predetermined unit acquired by the measured data acquisition unit 12. The measurement feature amount is the same kind of feature amount as the device feature amount stored by the feature amount storage unit 11.

The correction unit 15 corrects the measurement feature amount extracted by the feature amount extraction unit 13 based on unit feature information indicating a feature of the predetermined unit. That is, the correction unit 15 corrects the measurement feature amount in a direction in which a difference occurring between a feature amount measured in the measurement condition (standard condition) serving as the predetermined standard and the device feature amount due to disagreement between a measurement condition (standard condition) serving as the predetermined standard and a measurement condition (a condition specified by the unit feature information of the predetermined unit) at the time of measurement of the measured data of the predetermined unit for extracting the measurement feature amount is cancelled.

The unit feature information includes all of the factors which can have an influence on the measurement results (measured values) when the measured data of the predetermined unit of the electrical devices is measured with the measuring instrument installed in the predetermined unit. As the unit feature information, for example, information regarding an interconnect in the predetermined unit, specifically, the length of an interconnect between the measuring instrument and the electrical device, the length of an interconnect from a distribution board to each socket to which each electrical device is connected, the number of branches from the distribution board, the length of a cable included in each electrical device, whether there is an extension cord between the socket and each electrical device, and the length of the extension cord in a case in which there is the extension cord, are considered. Additionally, as the unit feature information, information for specifying an electrical device connected to an interconnect in the predetermined unit, for example, information for specifying the electrical devices connected to the same branch and connected to each other through an interconnect (for example, the number or kinds of electrical devices), is considered. Further, as the unit feature information, identification information (item number, a lot number, or the like) of the measuring instrument, information regarding a unique measurement error potentially included immediately after manufacturing of the measuring instrument, and information regarding an environment near the predetermined unit (for example, whether a transformer, an electrical substation, a large-scale power consumption facility is present nearby, or a distance to the transformer, the electrical substation, or the large-scale power consumption facility) are considered.

For example, the service provider that provides a service for visualizing operation states of electrical devices using the monitoring device 10 acquires the unit feature information as preparation to start providing the service from the service receiver. Then, the service provider generates correction information used for the correction unit 15 to correct the measurement feature amount, for example, a transfer function (a transfer function of outputting the corrected measurement feature amount when the measurement feature amount is input), in consideration of the acquired unit feature information, the measurement condition at the time of measurement of the reference data, the measurement condition serving as the predetermined standard, and the like and retains the correction information in the correction unit 15. For example, by setting an interconnect as an inductance and regarding an electrical device connected to the interconnect as an electrostatic capacitance, the correction information (for example, a transfer function) for specifying characteristics of a circuit as an LC circuit and to which the electrical device is connected at the time of measurement of the measured data of the predetermined unit and the reference data and cancelling a difference in the characteristics may also be generated. When the measurement feature amount is acquired from the unit feature information acquisition unit 14, the correction unit 15 inputs the measurement feature amount into, for example, the transfer function and obtains the corrected measurement feature amount.

The correction unit 25 corrects the device feature amount stored in the feature amount storage unit 11 based on the unit feature information indicating the feature of the predetermined unit. That is, the correction unit 25 corrects the device feature amount in a direction in which a difference occurring between the device feature amount and the feature amount measured in the measurement condition serving as the predetermined standard due to disagreement between the measurement condition at the time of measurement of the reference data for extracting the device feature amount and the measurement condition (standard condition) serving as the predetermined standard is cancelled. The correction of the device feature amount can be realized by the same unit as that of the correction of the measurement feature amount described in the first exemplary embodiment.

The corrected device feature amount storage unit 29 stores the corrected device feature amount corrected by the correction unit 25.

The presumption unit 56 presumes the electrical device being in operation using the corrected measurement feature amount and the corrected device feature amount. The presumption process by the presumption unit 56 is realized in conformity to the technology of the related art. Hereinafter, an example of the presumption process will be described.

In a case in which one or more electrical devices are operating in the predetermined unit, the corrected measurement feature amount is a feature amount obtained by adding the device feature amounts of one or more electrical devices. Accordingly, the presumption unit 56 compares one corrected device feature amount selected from the plurality of device feature amounts stored in the corrected device feature amount storage unit 29 or the feature amount obtained by adding the plurality of the device feature amounts of electrical devices to the corrected measurement feature amount and specifies a combination of the corrected device feature amounts which are identical to the corrected measurement feature amount (which may conceptually include a predetermined error range). Then, the presumption unit 56 presumes the electrical device corresponding to the corrected device feature amount included in the specified combination as the electrical device being in operation.

<Third Exemplary Embodiment>

In the first and second exemplary embodiments, the "measurement feature amount" or "the device feature amount" has been corrected in the direction in which the difference occurring between the measurement feature amount and the device feature amount due to disagreement between a measurement condition at the time of measurement of the reference data for extracting the device feature amount and the measurement condition (the condition specified by the unit feature information of the predetermined unit) at the time of measurement of the measured data of the predetermined unit for extracting the measurement feature amount is cancelled. In contrast, in a present exemplary embodiment, "measured data of predetermined unit" before extraction of the measurement feature amount is corrected in a direction in which a difference between a measurement feature amount and a device feature amount is cancelled.

Figure 9:
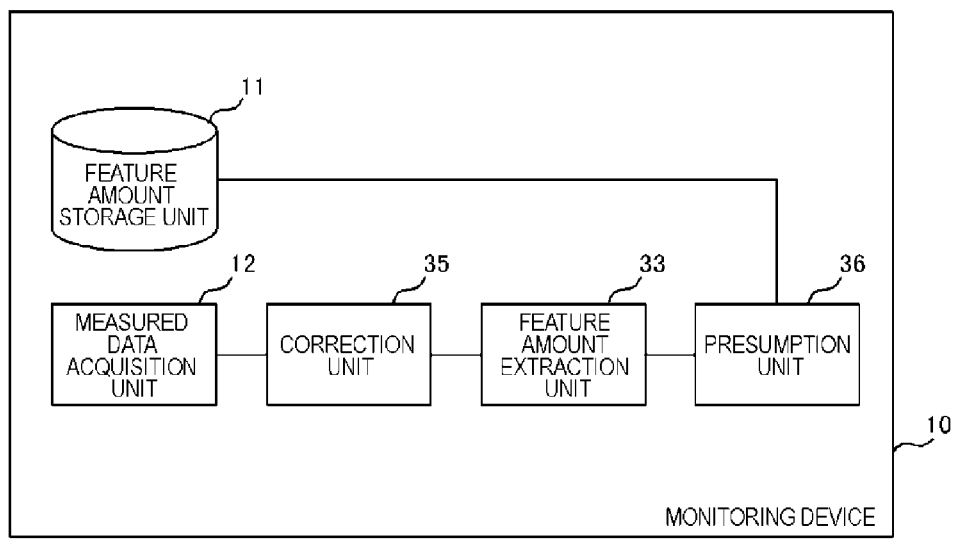
FIG. 9 is a diagram illustrating an example of a functional block diagram of the monitoring device according to the present exemplary embodiment.

FIG. 9 illustrates an example of a functional block diagram of a monitoring device 10 according to the present exemplary embodiment. As illustrated, the monitoring device 10 according to the present exemplary embodiment includes a feature amount storage unit 11, a measured data acquisition unit 12, a feature amount extraction unit 33, a correction unit 35, and a presumption unit 36. The configurations of the feature amount storage unit 11 and the measured data acquisition unit 12 are the same as those of the first exemplary embodiment, and thus the description thereof will not be repeated.

The correction unit 35 corrects the measured data of the predetermined unit acquired by the measured data acquisition unit 12 based on unit feature information indicating the feature of a predetermined unit. That is, the correction unit 35 corrects the measured data of the predetermined unit in a direction in which a difference occurring between the measurement feature amount and the device feature amount due to disagreement between a measurement condition at the time of measurement of the reference data for extracting the device feature amount and a measurement condition (a condition specified by the unit feature information of the predetermined unit) at the time of measurement of the measured data of the predetermined unit for extracting the measurement feature amount is cancelled. The correction of the measured data of the predetermined unit can be realized by the same unit as that of the correction of the measurement feature amount described in the first exemplary embodiment.

The feature amount extraction unit 33 extracts the feature amount (the corrected measurement feature amount) included in the corrected measured data of the predetermined unit from the corrected measured data of the predetermined unit corrected by the correction unit 35.

The presumption unit 36 presumes an electrical device being in operation using the corrected measurement feature amount extracted by the feature amount extraction unit 33 and the device feature amount stored in the feature amount storage unit 11. The process of presuming the electrical device being in operation by the presumption unit 36 is the same as that of the first exemplary embodiment, and thus the description thereof will not be repeated herein.

An application example of the monitoring device 10 according to the present exemplary embodiment is the same as that of the first exemplary embodiment.

Figure 10:
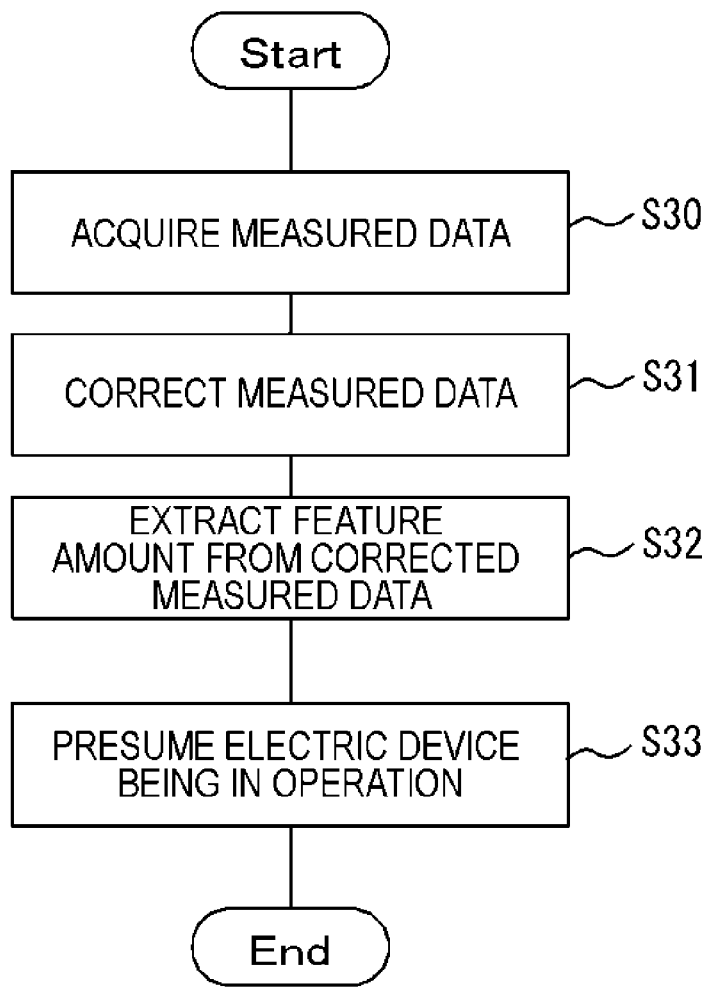
FIG. 10 is a flowchart illustrating an example of the flow of a process of the monitoring device according to the present exemplary embodiment.

Next, an example of the flow of a process of the monitoring device 10 according to the present exemplary embodiment will be described with reference to the flowchart of FIG. 10.

First, the service provider that provides a service for visualizing operation states of electrical devices using the monitoring device 10 acquires information for specifying the electrical devices installed in the predetermined unit and the unit feature information as preparation to start providing the service from a service receiver. The service provider extracts, for example, a predetermined device feature amount from the device feature amount database based on the acquired information for specifying the electrical devices installed in the predetermined unit and stores the predetermined device feature amount in the feature amount storage unit 11. Then, the service provider generates correction information used for the correction unit 35 to correct the measured data of the predetermined unit, for example, a transfer function (a transfer function of outputting the corrected measured data of the predetermined unit when the measured data of the predetermined unit is input), in consideration of the acquired unit feature information, the measurement condition at the time of measurement of the reference data, and the like and retains the correction information in the correction unit 35.

In S30, the measured data acquisition unit 12 acquires the measured data of the predetermined unit which is at least one of a total current consumption, a total power consumption, and a voltage measured in the predetermined unit. For example, the measured data acquisition unit 12 acquires the measured data of the predetermined unit measured by the measuring instrument installed near a power-feeding service entrance, a distribution board, or the like through a communication cable connecting the monitoring device 10 to the measuring instrument, a network such as the Internet or a LAN, or the like.

In S31, the correction unit 35 inputs the measured data of the predetermined unit acquired in S30 by the measured data acquisition unit 12 into the correction information (for example, the transfer function) retained in advance and obtains an output as the corrected measured data of the predetermined unit. In S32, the feature amount extraction unit 33 extracts the feature amount (the corrected measurement feature amount) included in the measured data of the predetermined unit from the corrected measured data of the predetermined unit. In S33, the presumption unit 36 presumes the electrical device being in operation using the device feature amount stored in the feature amount storage unit 11 and the corrected measurement feature amount extracted in S32 by the feature amount extraction unit 33.

According to the above-described present exemplary embodiment, it is possible to realize the same operation and effect as those of the first exemplary embodiment.

<Fourth Exemplary Embodiment>

In the first to third exemplary embodiments, the "measurement feature amount", the "device feature amount", and the "measured data of the predetermined unit" has been corrected in the direction in which the difference occurring between the measurement feature amount and the device feature amount due to disagreement between a measurement condition at the time of measurement of the reference data for extracting the device feature amount and the measurement condition (the condition specified by the unit feature information of the predetermined unit) at the time of measurement of the measured data of the predetermined unit for extracting the measurement feature amount is cancelled. In contrast, in a present exemplary embodiment, "reference data" before the extraction of the device feature amount is corrected in a direction in which a difference between a measurement feature amount and the device feature amount is cancelled.

Figure 11:
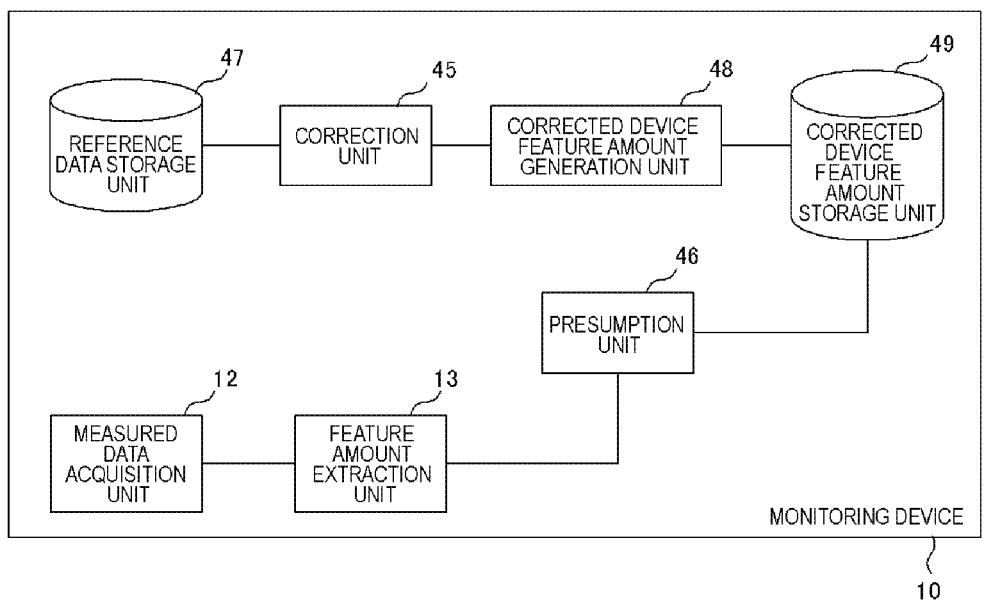
FIG. 11 is a diagram illustrating an example of a functional block diagram of the monitoring device according to the present exemplary embodiment.
Figure 12:
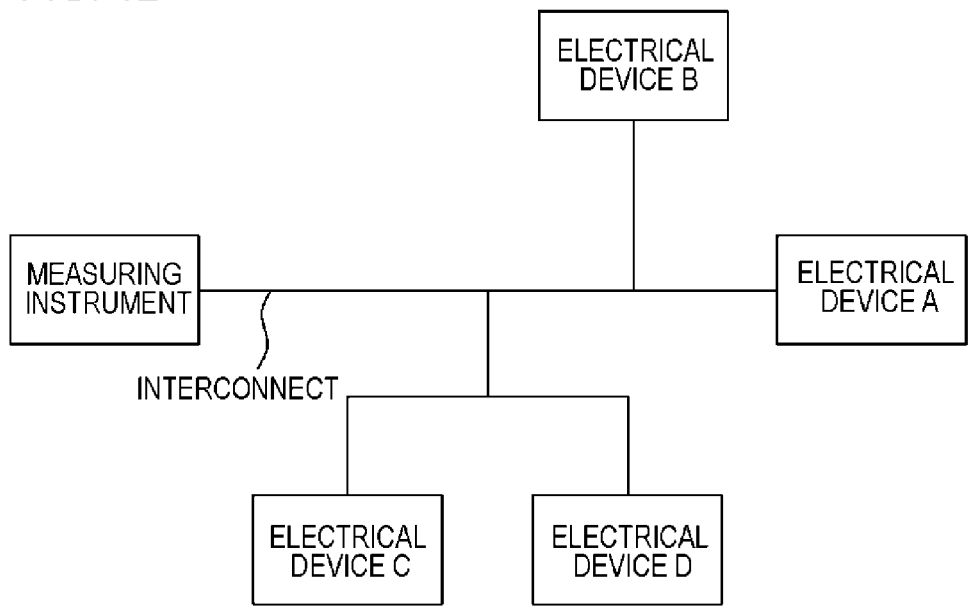
FIG. 12 is a conceptual diagram illustrating a problem of the monitoring device according to the present exemplary embodiment.
Figure 13:
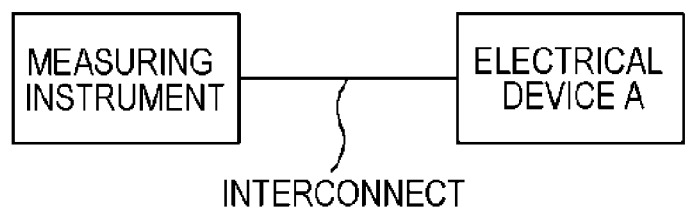
FIG. 13 is a conceptual diagram illustrating a problem of the monitoring device according to the present exemplary embodiment.

FIG. 11 illustrates an example of a functional block diagram of a monitoring device 10 according to the present exemplary embodiment. As illustrated, the monitoring device 10 according to the present exemplary embodiment includes a measured data acquisition unit 12, a feature amount extraction unit 13, a correction unit 45, a presumption unit 46, a reference data storage unit 47, a corrected device feature amount generation unit 48, and a corrected device feature amount storage unit 49. The configurations of the measured data acquisition unit 12 and the feature amount extraction unit 13 are the same as those of the first exemplary embodiment, and thus the description thereof will not be repeated.

The reference data storage unit 47 stores the reference data which is at least one of a current consumption, a power consumption, and a voltage measured when each of the plurality of electrical devices installed in the predetermined unit is placed in a different environment from the predetermined unit. For example, when an electrical device installed in the predetermined unit is specified, the service provider that provides a service for visualizing operation states of the electrical devices using the monitoring device 10 can extract the reference data of the specified electrical device from the reference data database described in the first exemplary embodiment and store the reference data in the reference data storage unit 47.

The correction unit 45 corrects the reference data of each of the plurality of electrical devices stored in the reference data storage unit 47 based on the unit feature information indicating a feature of the predetermined unit. That is, the correction unit 45 corrects the reference data in a direction in which a difference occurring between the measurement feature amount and the device feature amount due to disagreement between a measurement condition at the time of measurement of the reference data for extracting the device feature amount and a measurement condition (a condition specified by the unit feature information of the predetermined unit) at the time of measurement of the measured data of the predetermined unit for extracting the measurement feature amount is cancelled. The correction of the reference data can be realized by the same unit as that of the correction of the measurement feature amount described in the first exemplary embodiment.

The corrected device feature amount generation unit 48 extracts the corrected device feature amount which is the feature amount of each electrical device included in each piece of reference data from each piece of corrected reference data. The corrected device feature amount storage unit 49 stores the corrected device feature amount generated by the corrected device feature amount generation unit 48 in association with the identification information of each electrical device.

The presumption unit 46 presumes the electrical device being in operation using the measurement feature amount extracted by the feature amount extraction unit 13 and the corrected device feature amount stored in the corrected device feature amount storage unit 49. The process of presuming the electrical device being in operation by the presumption unit 46 is the same as that of the first exemplary embodiment, and thus the description thereof will not be repeated herein.

The monitoring device 10 according to the present exemplary embodiment may not include the correction unit 45, the reference data storage unit 47, and the corrected device feature amount generation unit 48. In this case, the correction unit 45, the reference data storage unit 47, and the corrected device feature amount generation unit 48 can be included in a different device from the monitoring device 10. The different device generates the corrected device feature amount, and then the generated corrected device feature amount is stored in the corrected device feature amount storage unit 49 of the monitoring device 10.

An application example of the monitoring device 10 according to the present exemplary embodiment is the same as that of the first exemplary embodiment.

Next, an example of the flow of a process of the monitoring device 10 according to the present exemplary embodiment will be described with reference to the flowchart of FIG. 8.

First, the service provider that provides a service for visualizing operation states of electrical devices using the monitoring device 10 acquires information for specifying the electrical devices installed in the predetermined unit and the unit feature information as preparation to start providing the service from a service receiver. The service provider extracts, for example, predetermined reference data from the reference data database based on the acquired information for specifying the electrical devices installed in the predetermined unit and stores the predetermined reference data in the reference data storage unit 47. Then, the service provider generates correction information used for the correction unit 45 to correct the reference data, for example, a transfer function (a transfer function of outputting the corrected reference data when the reference data is input), in consideration of the acquired unit feature information, the measurement condition at the time of measurement of the reference data, and the like and retains the correction information in the correction unit 45. Then, the correction unit 45 inputs the reference data stored in the reference data storage unit 47 into, for example, the transfer function and obtains the corrected reference data as an output. Thereafter, the corrected device feature amount generation unit 48 extracts the device feature amount from the corrected reference data and stores the device feature amount as the corrected device feature amount in the corrected device feature amount storage unit 49.

In S20, the measured data acquisition unit 12 acquires the measured data of the predetermined unit which is at least one of a total current consumption, a total power consumption, and a voltage measured in the predetermined unit. For example, the measured data acquisition unit 12 acquires the measured data of the predetermined unit measured by the measuring instrument installed near a power-feeding service entrance, a distribution board, or the like through a communication cable connecting the monitoring device 10 to the measuring instrument, a network such as the Internet or a LAN, or the like.

In S21, the feature amount extraction unit 13 extracts the measurement feature amount included in the measured data of the predetermined unit from the measured data of the predetermined unit acquired in S20. In S22, the presumption unit 26 presumes the electrical device being in operation using the corrected device feature amount stored in the corrected device feature amount storage unit 49 and the measurement feature amount acquired in S21 by the feature amount extraction unit 13.

According to the above-described present exemplary embodiment, it is possible to realize the same operation and effect as those of the first exemplary embodiment. Since the process of presuming the electrical device being in operation does not include the correction process by the correction unit 45, the presumption result can be calculated faster than in the first and third exemplary embodiments.

Here, examples of services realized based on a result presumed by the monitoring device 10 according to the first to fourth exemplary embodiments will be described.

For example, it is possible to give an advice for power saving. In the monitoring device 10 according to the first to fourth exemplary embodiments, it is possible to ascertain a temporal change of the operation states of the electrical devices in a day (from 00:00 to 24:00). Based on such an output, it is possible to specify a time period in which the electrical devices are used a lot and give an advice for intentionally reducing the use of the electrical devices during the time period.

As another example, it is possible to give a notification of a timing of maintenance of an electrical device (for example, cleaning of an air conditioner). In the monitoring device 10 according to the first to fourth exemplary embodiments, it is possible to calculate an accumulated operation time of each electrical device by accumulating presumption results. For example, it is possible to give a notification to request maintenance at a timing at which an accumulative time becomes a predetermined value. A current consumption, a power consumption, a voltage, a measurement feature amount, and the like can be changed due to breakdown of an electrical device or deterioration of some components over time. Accordingly, for example, it is possible to give a notification to give a request for maintenance when such a change is detected.

As still another example, it is possible to give an advice on use of a refrigerator. According to a loading state inside the refrigerator, a current consumption, a power consumption, a voltage, a measurement feature amount, and the like can be changed. In the monitoring device 10 according to the first to fourth exemplary embodiments, such a change can be detected. Based on the change, an overstuffed warning or a request for increasing storage since objects are few inside can be notified of.

As still another example, in the monitoring device 10 according to the first to fourth exemplary embodiments, in comparison to a history of previous presumption results, it is possible to detect whether a use pattern of electrical devices is different from at the normal time. In a case in which the user pattern of the electrical devices is different, there is a possibility of a certain change (for example, service receivers are involved in diseases or cases) occurring in service receivers (users of the electronic devices). Accordingly, in such a case, a contact destination registered in advance can be notified of the warning.

As still another example, in the monitoring device 10 according to the first to fourth exemplary embodiments, a life rhythm or the like of a user can be presumed based on a use pattern of electronic devices (for example, a use pattern in a day). Accordingly, a warning of improving the life rhythm can be given to a user of an irregular life rhythm (for example, activities are considerable in the night (use of many electronic devices in the night) and day activities and night activities irregularly appear).

In the third and fourth exemplary embodiments, one of the "reference data" and the "measured data of predetermined unit" has been corrected such that the difference occurring between the reference data amount and the measured data of the predetermined unit is cancelled. However, both of the "reference data" and the "measured data of the predetermined unit" may be corrected such that a difference occurring between the device feature amount, and the measurement feature amount, and a feature amount measured in a measurement condition serving as a predetermined standard.

Figure 15:
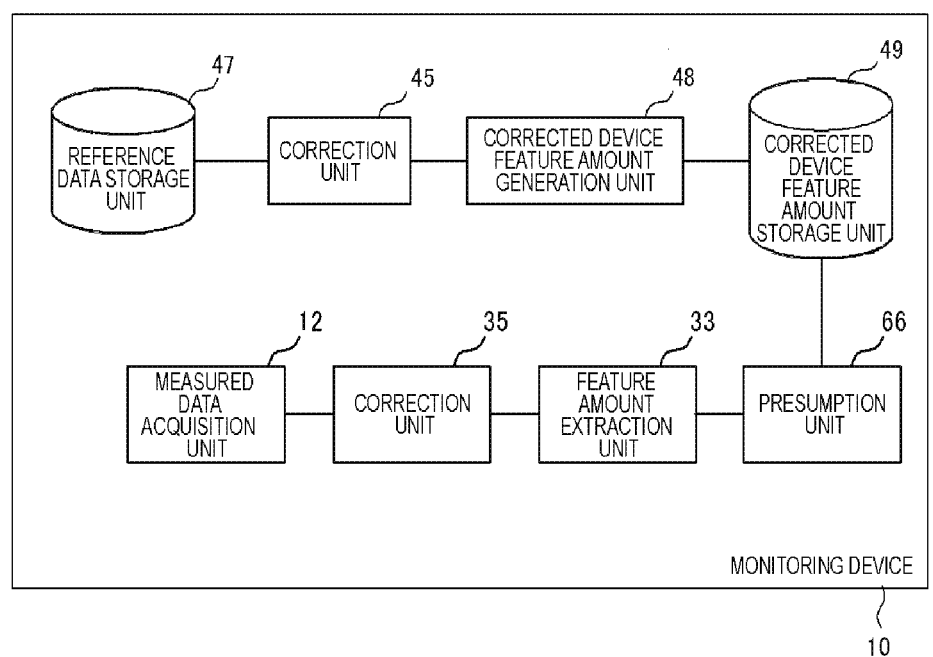
FIG. 15 is a diagram illustrating an example of a functional block diagram of a monitoring device according to a modification example of the present exemplary embodiment.

Specifically, a configuration according to a modification example of the present exemplary embodiment will be described. FIG. 15 illustrates an example of a functional block diagram of a monitoring device 10 according to the modification example of the present exemplary embodiment. As illustrated, the monitoring device 10 according to the present exemplary embodiment includes a measured data acquisition unit 12, a correction unit (second correction unit) 35, a feature amount extraction unit 33, a reference data storage unit 47, a correction unit (first correction unit) 45, a corrected device feature amount generation unit 48, a corrected device feature amount storage unit 49, and a presumption unit 66. The configuration of the measured data acquisition unit 12 is the same as that of the first exemplary embodiment, and thus the description thereof will not be repeated herein. The configuration of the reference data storage unit 47 is the same as that of the fourth exemplary embodiment, and thus the description thereof will not be repeated herein.

The correction unit 35 corrects the measured data of the predetermined unit acquired by the measured data acquisition unit 12 based on unit feature information indicating a feature of the predetermined unit. That is, the correction unit 35 corrects the measured data of the predetermined unit in a direction in which a difference occurring between the measurement feature amount and a feature amount measured in the measurement condition (standard condition) serving as the predetermined standard due to disagreement between a measurement condition (standard condition) serving as the predetermined standard and a measurement condition (a condition specified by the unit feature information of the predetermined unit) at the time of measurement of the measured data of the predetermined unit for extracting the measurement feature amount is cancelled. The correction of the measured data of the predetermined unit can be realized by the same unit as the correction of the measured data of the predetermined unit described in the third exemplary embodiment.

The feature amount extraction unit 33 extracts the feature amount (corrected measurement feature amount) included in the corrected measured data of the predetermined unit from the corrected measured data of the predetermined unit corrected by the correction unit 35.

The correction unit 45 corrects the reference data of each of the plurality of electrical devices stored in the reference data storage unit 47 based on the unit feature information indicating the feature of the predetermined unit. That is, the correction unit 45 corrects the reference data in a direction in which a difference occurring between the device feature amount and the feature amount measured in the measurement condition (standard condition) serving as the predetermined standard due to disagreement between the measurement condition at the time of measurement of the reference data for extracting the device feature amount and the measurement condition (standard condition) serving as the predetermined standard is cancelled. The correction of the reference data can be realized by the same unit as the correction of the reference data described in the fourth exemplary embodiment.

The corrected device feature amount generation unit 48 extracts the corrected device feature amount which is the feature amount of each electrical device included in each piece of reference data from each piece of corrected reference data. The corrected device feature amount storage unit 49 stores the corrected device feature amount generated by the corrected device feature amount generation unit 48 in association with the identification information of each electrical device.

The presumption unit 66 presumes the electrical device being in operation using the feature amount extracted from the measured data of the predetermined unit corrected by the correction unit 35 and the corrected device feature amount stored in the corrected device feature amount storage unit 49. The process of presuming the electrical device being in operation by the presumption unit 66 is the same as that of the first exemplary embodiment, and thus the description thereof will not be repeated herein.

<Fifth Exemplary Embodiment<

In the first to fourth exemplary embodiments, the correction information (for example, the transfer function) for correcting the measurement feature amount has been generated in consideration of the unit feature information of the measurement environment or the measurement condition at the time of measurement of the reference data, and the corrected feature amount or data have been obtained using the correction information. In contrast, in a present exemplary embodiment, correction information (for example, a transfer function) for correcting at least one of a "measurement feature amount", a "device feature amount (reference feature amount)", "measured data of the predetermined unit" and "reference data" is generated based on measured data of the predetermined unit measured in a predetermined unit and reference data, and a corrected feature amount or data is obtained using the correction information. According to the present exemplary embodiment, the unit feature information used in the first to fourth exemplary embodiments is not necessary.

<Fifth Exemplary Embodiment: Functional Configuration>

Figure 16:
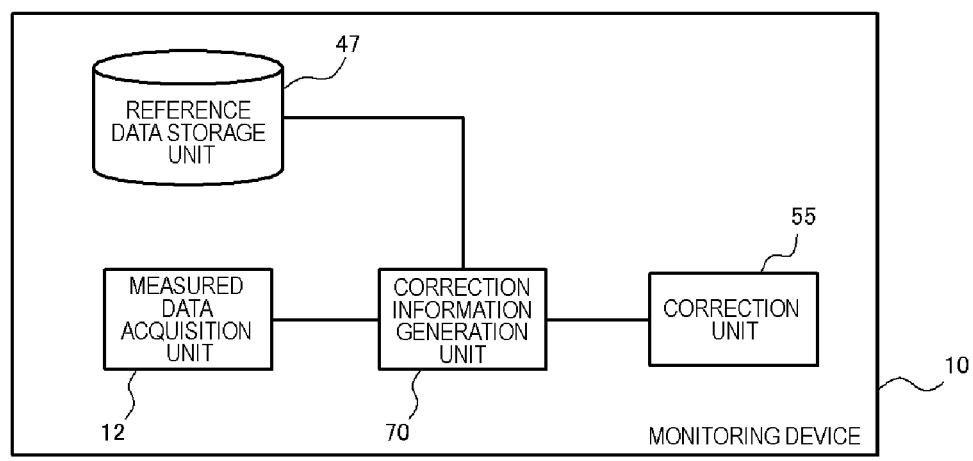
FIG. 16 is a diagram illustrating an example of a functional block diagram of the monitoring device according to the present exemplary embodiment.

FIG. 16 illustrates an example of a functional block diagram according to the present exemplary embodiment. A monitoring device 10 according to the present exemplary embodiment includes a measured data acquisition unit 12, a reference data storage unit 47, a correction information generation unit 70, and a correction unit 55. The configurations of the measured data acquisition unit 12 and the reference data storage unit 47 are the same as those of the first to fourth exemplary embodiments, and thus the description thereof will not be repeated. The correction unit 55 is the same as that of the first to fourth exemplary embodiments except that the corrected feature amount or the data is obtained using correction information (for example, a transfer function) generated by the correction information generation unit 70, and thus the description thereof will not be repeated.

Figure 17:
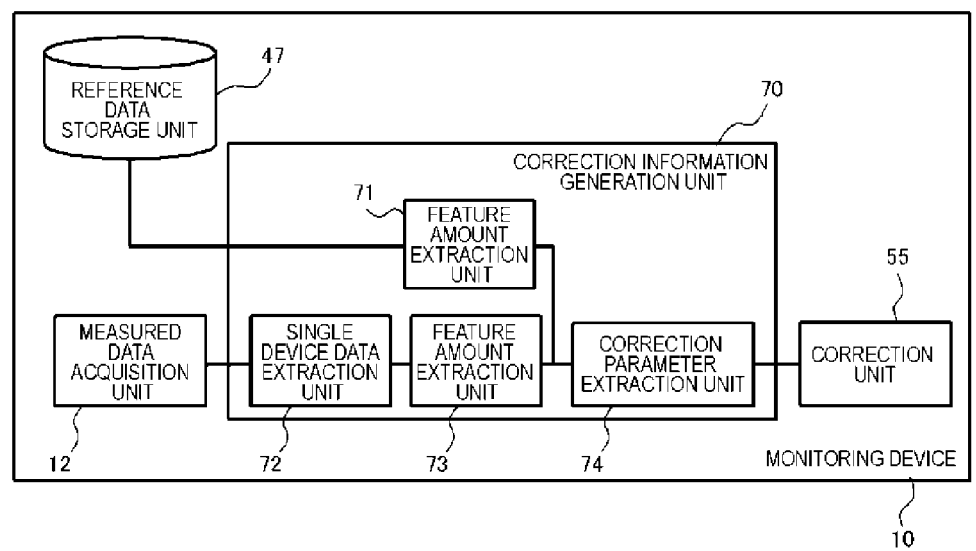
FIG. 17 is a diagram illustrating an example of a functional block diagram of the monitoring device according to the present exemplary embodiment.

The correction information generation unit 70 generates correction information, for example, a transfer function, for cancelling a difference between the measured data of the predetermined unit and the reference data based on the measured data of the predetermined unit and the reference data. The correction information (for example, a transfer function) generated by the correction information generation unit 70 is preserved in the correction unit 55. As illustrated in FIG. 17, the correction information generation unit 70 includes, for example, a single device data extraction unit 72, feature amount extraction units 71 and 73, and a correction parameter extraction unit 74.

The single device data extraction unit 72 extracts data of a single device from the measured data of the predetermined unit and links the extracted data to information such as a device name. A unit extracting the data of the single device from the measured data of the predetermined unit is not particularly limited. For example, a time point at which a measured value varies by a predetermined level or more in the measured data of the predetermined unit may be specified as a time point at which the operation state of a certain electrical device is changed. A difference in data before and after the time point may be extracted as the measured data of the predetermined unit of the electrical device. Thereafter, an input of the device name or the like of the electrical device of which the operation state is changed is received from the user. Instead of receiving the input from a user, the identification information of each electrical device can also be obtained by separately measuring another sensor data information at the same time, for example, obtaining the operation state of a cooling or heating device from a temperature sensor outside or inside a building, obtaining the operation state of a ventilating fan or the like from a vibration sensor, or obtaining the operation state of a lighting device from an illuminance sensor, and examining a correlation with such a sensor. In this way, the electrical device of which the operation state is changed at the time point at which a measured value varies by the predetermined level or more in the measured data of the predetermined unit may be specified with another sensor data. The single device data extraction unit 72 can also use a method to be described in the following example.

The feature amount extraction unit 71 extracts a predetermined feature amount from the reference data of each electrical device. The feature amount extraction unit 73 extracts the predetermined feature amount from the measured data of the predetermined unit of each electrical device extracted by the single device data extraction unit 72. The correction parameter extraction unit 74 generates correction information (for example, a transfer function) for correcting at least one of the "measurement feature amount" and the "device feature amount (reference feature amount)" in a direction in which a difference between the device feature amount (reference feature amount) of a first electrical device extracted by the feature amount extraction unit 71 and the measurement feature amount of the first electrical device extracted by the feature amount extraction unit 73 is cancelled. For example, the correction information may be information that cancels the difference by multiplying at least one of the "measurement feature amount" and the "device feature amount (reference feature amount)" by a predetermined coefficient or may also be information as in the following example.

The content of the correction information generation unit 70 in FIG. 17 is one example and any other form may be used, of course. For example, a configuration in which the feature amount extraction units 71 and 73 are not included can also be realized. In this case, the reference data of the first electrical device is input from the reference data storage unit 47 to the correction parameter extraction unit 74. The measured data of the predetermined unit of the first electrical device is input from the single device data extraction unit 72 to the correction parameter extraction unit 74. Then, the correction parameter extraction unit 74 generates correction information (for example, a transfer function) for correcting at least one of the "reference data" and the "measured data of the predetermined unit" in a direction in which a difference between the reference data and the measured data of the predetermined unit is cancelled. For example, the correction information may be information that cancels the difference by multiplying at least one of the "reference data" and the "measured data of the predetermined unit" by a predetermined coefficient or may also be information as in the following example.

Further, in FIGS. 16 and 17, the correction information generation unit 70 is included in the monitoring device 10, but the correction information generation unit 70 may be located in another environment on an external server.

For example, a correction information generation device is realized which includes a unit that acquires measured data of the predetermined unit which is at least one of a total current consumption, a total power consumption, and a voltage of an electrical device measured in a first environment, a unit that acquires reference data which is at least one of a total current consumption, a total power consumption, and a voltage of an electrical device measured in a second environment different from the first environment, and a unit (the correction information generation unit 70) that generates correction information for cancelling a difference between the measured data of the predetermined unit and the reference data based on the measured data of the predetermined unit and the reference data.

A correction information generation device is realized which includes a unit that acquires measured data of the predetermined unit which is at least one of a total current consumption, a total power consumption, and a voltage of an electrical device measured in a first environment, a unit that acquires a measurement feature amount which is a feature amount included in the measured data of the predetermined unit, a unit that acquires reference data which is at least one of a total current consumption, a total power consumption, and a voltage of an electrical device measured in a second environment different from the first environment, a unit that acquires a device feature amount which is a feature amount included in the reference data, and a unit (the correction information generation unit 70) that generates correction information for cancelling a difference between the device feature amount and the measurement feature amount based on the device feature amount and the measurement feature amount.

<Example of Fifth Exemplary Embodiment>

Next, the fifth exemplary embodiment will be described using a specific example. First, data of a voltage waveform and a current waveform in a power trunk line is measured in a certain user environment. The voltage waveform is measured using, for example, resistance dividing from a socket in the user environment. The current waveform is measured by installing a clamp type current transformer (CT) or the like in a main portion of a distribution board. By performing phase focusing at a zero cross point at which a voltage becomes from a negative value to a positive value, the measured voltage and current are subjected to phase adjustment so that the voltage and current waveforms become data of the same phase in each measurement.

Next, the data of the current waveform of the single device is extracted from time-series data of the measured voltage and current waveforms. For example, power time-series data is generated from the time-series data of the voltage and current waveforms, and an average value and a variance value of time-series data of each device are calculated. A power threshold value is generated using the average value and the variance value, a point at which a power value exceeds the threshold value is set as a switch timing of power ON/OFF of a device, and the data of the current waveform of the single device is extracted by averaging the time-series data of the current waveform before and after the switch timing and taking a difference. The data of the current waveform of the single device may, of course, be extracted individually, for example, by installing a current sensor in a socket.

Information such as the device name or the like is added to the extracted data of the current waveform of the single device. For example, when data of a current waveform is newly extracted, device name information is added by outputting an alarm to a user and receiving an input of the device name.

Next, the data of the current waveform to which the device name information is added is transmitted to an external server. In the external device, reference data in which the device name and the current waveform are combined is prepared in advance. Thus, a correction parameter (transfer function) is extracted by comparing the reference data to the data of the current waveform of the device transmitted from the user environment. The reference data and the measured data can be matched by the device name information, and thus the correction parameter may be extracted in a location other than the external server.

Next, a specific method of extracting the correction parameter (transfer function) will be described. The reference data of the current waveform and the measured data of the predetermined unit of the current waveform are resolved into harmonic components by FFT or the like and two values R and T (weighted averages) below are obtained using vectors r, $\Delta r$, and $\Delta \Theta$. Here, r indicates a harmonic intensity of the data in the user environment, $\Delta$ indicates a difference in a value in both environments, i indicates a harmonic order, and $\Theta$ indicates a value obtained by dividing the phase of the harmonic by the harmonic order (a value at which the phase of each harmonic matches the phase of a standard wave).

$$R = \frac{\sum_i |r_i|\left(1 + \frac{\Delta r_i}{r_i}\right)}{\sum_i |r_i|} \quad (1)$$

$$T = \frac{\sum_i |r_i \Delta \theta_i| \Delta \theta_i}{\sum_i |r_i \Delta \theta_i|} \quad (2)$$

Using such a correction parameter, a current waveform reference data f(t) of the external server is corrected to a current waveform measured data R×f(t−T) of a user environment. The correction parameter has a different value for each device. Here, t indicates the phase of the current waveform. T indicates a phase difference to be corrected and may be converted to a time. In this case, t indicates a time.

Figure 18:
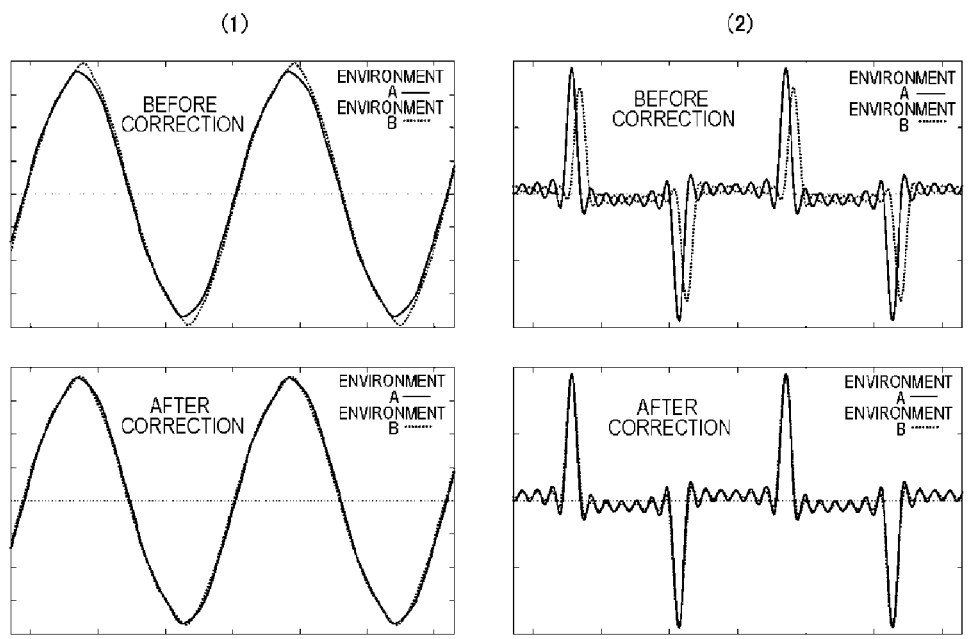
FIG. 18 is a diagram illustrating operation and effect of the present exemplary embodiment.

FIG. 18 illustrates examples of current waveforms corrected by the method of the present example. On examination of the data before the correction, it can be understood that a deviation in the phase or the size occurs irrespective of the fact that the same electrical device is operating in the same state, when the environment is different. On examination of the data after the correction, it can be understood that the deviation in the phase or the size occurring due to a difference between the environments is corrected by the correction of the present example, and thus the data is substantially identical.

The method of obtaining R and T are not limited to the methods. For example, R and T may be obtained only from information regarding the intensity or phase of the standard wave rather than obtaining the weighted averages. For example, a method of deciding R and T so that an error function is minimum by fitting may also be used. The method of generating the transfer function is not limited to FIG. 17 either. A method of deciding R and T so that an integral of the absolute values of a difference between functions of external server data and user environment data generated based on data subjected to FFT is minimum during one period of waveform may also be used.

<Fifth Exemplary Embodiment: Effects>

In the fifth exemplary embodiment, all of the values can be corrected using the deviation in the two values of the intensity and the phase rather than individually correcting the values of the feature amounts and the current waveform. Therefore, not only the current waveform but also the feature amount vectors of the phase or the intensity of the harmonic can also be corrected.

In the fifth exemplary embodiment, it is not necessary to generate the correction information (for example, a transfer function) regarding all of the states and the correction information (for example, a transfer function) regarding each electrical device may be generated. Therefore, the configuration of the correction unit 55 is not complicated.

Further, in the fifth exemplary embodiment, the correction information (for example, a transfer function) can be generated merely comparing the data. Therefore, even in a case in which the user environment is temporally changed and presumption precision deteriorates due to, for example a change in the configuration of the electrical devices of each household, the correction information (for example, a transfer function) can be newly updated and the presumption precision can be prevented from deteriorating. By providing a threshold value of the precision, detecting the deterioration in the presumption precision, and updating the correction information (for example, a transfer function) at each time, it is also possible to maintain the presumption precision within given precision. The presumption precision at which the threshold value is provided herein may be presumption precision within any range, that is, presumption precision of devices in an entire building, presumption precision of an individual device, or presumption precision in a group of several devices.

Furthermore, in the fifth exemplary embodiment, when a method of generating a plurality of pieces of correction information (for example, transfer functions) by obtaining a plurality of reference waveforms using a plurality of reference loads is used, the correction information (for example, transfer functions) can also be generated in advance without operating devices.

Also, in the fifth exemplary embodiment, the correction information (for example, a transfer function) is generated merely by comparing the data. Therefore, even when an environment of each household is not considered in detail, the correction information (for example, a transfer function) can be generated.

In a building such as an apartment or a hotel in which environments of rooms are similar, when the correction information (for example, a transfer function) is generated in one room according to the fifth exemplary embodiment, the same correction information (for example, a transfer function) can be utilized in a plurality of other rooms.

When the fifth and fourth exemplary embodiments are combined, the reference data of an external server can be corrected in regard to each electrical device present in the user environment, learning can be subsequently performed to presume device states on the external server, and a presumption function can be generated. By transmitting the presumption function generated in the external server to the user environment, it is possible to receive a service of visualizing power so that each device state can be presumed with high precision from the data of the current waveform without generating the presumption function in the user environment.

Hereinafter, examples of reference configurations will be appended.

1. A monitoring device including:

a feature amount storage unit that stores a device feature amount which is a feature amount of each of a plurality of electrical devices installed in a predetermined unit in operation;

a measured data acquisition unit that acquires measured data which is at least one of a total current consumption, a total power consumption, and a voltage measured in the predetermined unit;

a feature amount extraction unit that acquires a measurement feature amount which is the feature amount included in the measured data;

a correction unit that corrects a first feature amount which is the device feature amount or the measurement feature amount based on unit feature information indicating a feature of the predetermined unit; and a presumption unit that presumes the electrical device being in operation using the corrected first feature amount, and a second feature amount which is the device feature amount or the measurement feature amount, and a different feature amount from the first feature amount.

2. A monitoring device including:

a feature amount storage unit that stores a device feature amount which is a feature amount of each of a plurality of electrical devices installed in a predetermined unit in operation;

a measured data acquisition unit that acquires measured data which is at least one of a total current consumption, a total power consumption, and a voltage measured in the predetermined unit;

a feature amount extraction unit that acquires a measurement feature amount which is the feature amount included in the measured data;

a first correction unit that corrects the device feature amount based on unit feature information indicating a feature of the predetermined unit;

a second correction unit that corrects the measurement feature amount based on the unit feature information; and a presumption unit that presumes the electrical device being in operation using the corrected device feature amount and the corrected measurement feature amount.

3. A monitoring device including:
a feature amount storage unit that stores a device feature amount which is a feature amount of each of a plurality of electrical devices installed in a predetermined unit in operation;
a measured data acquisition unit that acquires measured data which is at least one of a total current consumption, a total power consumption, and a voltage measured in the predetermined unit;
a correction unit that corrects the measured data based on unit feature information indicating a feature of the predetermined unit;
a feature amount extraction unit that acquires a corrected measurement feature amount which is the feature amount included in the corrected measured data; and
a presumption unit that presumes the electrical device being in operation using the device feature amount and the corrected measurement feature amount.

4. A monitoring device including:
a reference data storage unit that stores reference data which is at least one of a current consumption, a power consumption, and a voltage measured using each of a plurality of electrical devices installed in a predetermined unit, placed in a different environment from the predetermined unit;
a correction unit that corrects the reference data of each of the plurality of electrical devices based on unit feature information indicating a feature of the predetermined unit;
a corrected device feature amount generation unit that acquires a corrected device feature amount which is a feature amount of each of the electrical devices included in each piece of the corrected reference data;
a measured data acquisition unit that acquires measured data which is at least one of the total current consumption, the total power consumption, and the voltage measured in the predetermined unit;
a feature amount extraction unit that acquires a measurement feature amount which is the feature amount included in the measured data; and
a presumption unit that presumes the electrical device being in operation using the corrected device feature amount and the measurement feature amount.

5. A monitoring device including:
a reference data storage unit that stores reference data which is at least one of a current consumption, a power consumption, and a voltage measured using each of a plurality of electrical devices installed in a predetermined unit, placed in a different environment from the predetermined unit;
a first correction unit that corrects the reference data of each of the plurality of electrical devices based on unit feature information indicating a feature of the predetermined unit;
a corrected device feature amount generation unit that acquires a corrected device feature amount which is a feature amount of each of the electrical devices included in each piece of the corrected reference data;
a measured data acquisition unit that acquires measured data which is at least one of the total current consumption, the total power consumption, and the voltage measured in the predetermined unit;
a second correction unit that corrects the measured data based on the unit feature information;
a feature amount extraction unit that acquires a corrected measurement feature amount which is the feature amount included in the corrected measured data; and
a presumption unit that presumes the electrical device being in operation using the corrected device feature amount and the corrected measurement feature amount.

6. The monitoring device according to any one of 1 to 3, wherein the device feature amount is a feature amount of each of the electrical devices extracted from reference data which is at least one of the current consumption, the power consumption, and the voltage measured using each of the plurality of electrical devices installed in the predetermined unit, placed in a different environment from the predetermined unit.

7. The monitoring device according to any one of 1 to 6, wherein the unit feature information includes at least one of information regarding an interconnect in the predetermined unit and information for specifying the electrical device connected to the interconnect in the predetermined unit.

8. The monitoring device according to 7 dependent on any one of 1, 3, and 4,
wherein the correction unit performs the correction in consideration of a feature of the predetermined unit as an LC circuit specified by setting the interconnect in the predetermined unit as inductance and regarding the electrical device connected to the interconnect in the predetermined unit as electrostatic capacitance.

9. The monitoring device according to 7 dependent on 2 or 5,
wherein the first and second correction units perform the correction in consideration of a feature of the predetermined unit as an LC circuit specified by setting the interconnect in the predetermined unit as inductance and regarding the electrical device connected to the interconnect in the predetermined unit as electrostatic capacitance.

10. A monitoring system including:
the monitoring device according to any one of 1 to 9; and
a transmission device that acquires measured data which is at least one of a total current consumption, a total power consumption, and a voltage measured by a measuring instrument installed in the predetermined unit and transmits the measured data to the monitoring device.

11. A monitoring method performed by a computer that stores in advance a device feature amount which is a feature amount of each of a plurality of electrical devices installed in a predetermined unit in operation, the method including:
a measured data acquisition step of acquiring measured data which is at least one of a total current consumption, a total power consumption, and a voltage measured in the predetermined unit;
a feature amount extraction step of acquiring a measurement feature amount which is the feature amount included in the measured data;
a correction step of correcting a first feature amount which is the device feature amount or the measurement feature amount based on unit feature information indicating a feature of the predetermined unit; and
a presumption step of presuming the electrical device being in operation using the corrected first feature amount, and a second feature amount which is the device feature amount or the measurement feature amount, and a different feature amount from the first feature amount.

12. A monitoring method performed by a computer that stores in advance a device feature amount which is a feature amount of each of a plurality of electrical devices installed in a predetermined unit in operation, the method including:

a measured data acquisition step of acquiring measured data which is at least one of a total current consumption, a total power consumption, and a voltage measured in the predetermined unit;

a feature amount extraction step of acquiring a measurement feature amount which is the feature amount included in the measured data;

a first correction step of correcting the device feature amount based on unit feature information indicating a feature of the predetermined unit;

a second correction step of correcting the measurement feature amount based on the unit feature information; and a presumption step of presuming the electrical device being in operation using the corrected device feature amount and the corrected measurement feature amount.

13. A monitoring method performed by a computer that stores in advance a device feature amount which is a feature amount of each of a plurality of electrical devices installed in a predetermined unit in operation, the method including:

a measured data acquisition step of acquiring measured data which is at least one of a total current consumption, a total power consumption, and a voltage measured in the predetermined unit;

a correction step of correcting the measured data based on unit feature information indicating a feature of the predetermined unit;

a feature amount extraction step of acquiring a corrected measurement feature amount which is the feature amount included in the corrected measured data; and a presumption step of presuming the electrical device being in operation using the device feature amount and the corrected measurement feature amount.

14. A monitoring method performed by a computer that stores in advance reference data which is at least one of a current consumption, a power consumption, and a voltage measured using each of a plurality of electrical devices installed in a predetermined unit, placed in a different environment from the predetermined unit, the method including:

a correction step of correcting the reference data of each of the plurality of electrical devices based on unit feature information indicating a feature of the predetermined unit;

a corrected device feature amount generation step of acquiring a corrected device feature amount which is a feature amount of each of the electrical devices included in each piece of the corrected reference data;

a measured data acquisition step of acquiring measured data which is at least one of the total current consumption, the total power consumption, and the voltage measured in the predetermined unit;

a feature amount extraction step of acquiring a measurement feature amount which is the feature amount included in the measured data; and a presumption step of presuming the electrical device being in operation using the corrected device feature amount and the measurement feature amount.

15. A monitoring method performed by a computer that stores in advance reference data which is at least one of a current consumption, a power consumption, and a voltage measured using each of a plurality of electrical devices installed in a predetermined unit, placed in a different environment from the predetermined unit, the method including:

a first correction step of correcting the reference data of each of the plurality of electrical devices based on unit feature information indicating a feature of the predetermined unit;

a corrected device feature amount generation step of acquiring a corrected device feature amount which is a feature amount of each of the electrical devices included in each piece of the corrected reference data;

a measured data acquisition step of acquiring measured data which is at least one of the total current consumption, the total power consumption, and the voltage measured in the predetermined unit;

a second correction step of correcting the measured data based on the unit feature information;

a feature amount extraction step of acquiring a corrected measurement feature amount which is the feature amount included in the corrected measured data; and a presumption step of presuming the electrical device being in operation using the corrected device feature amount and the corrected measurement feature amount.

16. The monitoring method according to any one of 11 to 13, wherein the device feature amount is a feature amount of each of the electrical devices extracted from reference data which is at least one of the current consumption, the power consumption, and the voltage measured using each of a plurality of electrical devices installed in a predetermined unit, placed in a different environment from the predetermined unit.

17. The monitoring method according to any one of 11 to 16, wherein the unit feature information includes at least one of information regarding an interconnect in the predetermined unit and information for specifying the electrical device connected to the interconnect in the predetermined unit.

18. The monitoring method according to 17 dependent on any one of 11, 13, and 14, wherein in the correction step, the correction is performed in consideration of a feature of the predetermined unit as an LC circuit specified by setting the interconnect in the predetermined unit as inductance and regarding the electrical device connected to the interconnect in the predetermined unit as electrostatic capacitance.

19. The monitoring method according to 17 dependent on 12 or 15, wherein in the first and second correction steps, the correction is performed in consideration of a feature of the predetermined unit as an LC circuit specified by setting the interconnect in the predetermined unit as inductance and regarding the electrical device connected to the interconnect in the predetermined unit as electrostatic capacitance.

20. A program causing a computer to function as: a feature amount storage unit that stores a device feature amount which is a feature amount of each of a plurality of electrical devices installed in a predetermined unit in operation;

a measured data acquisition unit that acquires measured data which is at least one of a total current consumption, a total power consumption, and a voltage measured in the predetermined unit;

a feature amount extraction unit that acquires a measurement feature amount which is the feature amount included in the measured data;

a correction unit that corrects a first feature amount which is the device feature amount or the measurement feature amount based on unit feature information indicating a feature of the predetermined unit; and a presumption unit that presumes the electrical device being in operation using the corrected first feature amount, and a second feature amount which is the device feature amount or the measurement feature amount, and a different feature amount from the first feature amount.

21. A program causing a computer to function as: a feature amount storage unit that stores a device feature amount which is a feature amount of each of a plurality of electrical devices installed in a predetermined unit in operation;
a measured data acquisition unit that acquires measured data which is at least one of a total current consumption, a total power consumption, and a voltage measured in the predetermined unit;
a feature amount extraction unit that acquires a measurement feature amount which is the feature amount included in the measured data;
a first correction unit that corrects the device feature amount based on unit feature information indicating a feature of the predetermined unit;
a second correction unit that corrects the measurement feature amount based on the unit feature information; and
a presumption unit that presumes the electrical device being in operation using the corrected device feature amount and the corrected measurement feature amount.

22. A program causing a computer to function as:
a feature amount storage unit that stores a device feature amount which is a feature amount of each of a plurality of electrical devices installed in a predetermined unit in operation;
a measured data acquisition unit that acquires measured data which is at least one of a total current consumption, a total power consumption, and a voltage measured in the predetermined unit;
a correction unit that corrects the measured data based on unit feature information indicating a feature of the predetermined unit;
a feature amount extraction unit that acquires a corrected measurement feature amount which is the feature amount included in the corrected measured data; and
a presumption unit that presumes the electrical device being in operation using the device feature amount and the corrected measurement feature amount.

23. A program causing a computer to function as:
a reference data storage unit that stores reference data which is at least one of a current consumption, a power consumption, and a voltage measured using each of a plurality of electrical devices installed in a predetermined unit, placed in a different environment from the predetermined unit;
a correction unit that corrects the reference data of each of the plurality of electrical devices based on unit feature information indicating a feature of the predetermined unit;
a corrected device feature amount generation unit that acquires a corrected device feature amount which is a feature amount of each of the electrical devices included in each piece of the corrected reference data;
a measured data acquisition unit that acquires measured data which is at least one of the total current consumption, the total power consumption, and the voltage measured in the predetermined unit;
a feature amount extraction unit that acquires a measurement feature amount which is the feature amount included in the measured data; and
a presumption unit that presumes the electrical device being in operation using the corrected device feature amount and the measurement feature amount.

24. A program causing a computer to function as:
a reference data storage unit that stores reference data which is at least one of a current consumption, a power consumption, and a voltage measured using each of a plurality of electrical devices installed in a predetermined unit, placed in a different environment from the predetermined unit;
a first correction unit that corrects the reference data of each of the plurality of electrical devices based on unit feature information indicating a feature of the predetermined unit;
a corrected device feature amount generation unit that acquires a corrected device feature amount which is a feature amount of each of the electrical devices included in each piece of the corrected reference data;
a measured data acquisition unit that acquires measured data which is at least one of the total current consumption, the total power consumption, and the voltage measured in the predetermined unit;
a second correction unit that corrects the measured data based on the unit feature information;
a feature amount extraction unit that acquires a corrected measurement feature amount which is the feature amount included in the corrected measured data; and
a presumption unit that presumes the electrical device being in operation using the corrected device feature amount and the corrected measurement feature amount.

25. The program according to any one of 20 to 22,
wherein the device feature amount is a feature amount of each of the electrical devices extracted from reference data which is at least one of the current consumption, the power consumption, and the voltage measured using each of a plurality of electrical devices installed in a predetermined unit, placed in a different environment from the predetermined unit.

26. The program according to any one of 20 to 25,
wherein the unit feature information includes at least one of information regarding an interconnect in the predetermined unit and information for specifying the electrical device connected to the interconnect in the predetermined unit.

27. The program according to 26 dependent on any one of 20, 22, and 23,
wherein the correction unit performs the correction in consideration of a feature of the predetermined unit as an LC circuit specified by setting the interconnect in the predetermined unit as inductance and regarding the electrical device connected to the interconnect in the predetermined unit as electrostatic capacitance.

28. The program according to 26 dependent on 21 or 24,
wherein the first and second correction units perform the correction in consideration of a feature of the predetermined unit as an LC circuit specified by setting the interconnect in the predetermined unit as inductance and regarding the electrical device connected to the interconnect in the predetermined unit as electrostatic capacitance.

This application claims priority from Japanese Patent Application No. 2014-014002 filed on Jan. 29, 2014 and Japanese Patent Application No. 2014-169097 filed on Aug. 22, 2014, the content of which is incorporated herein by reference in its entirety.

The invention claimed is:
1. A monitoring device comprising:
a feature amount storage unit that stores a device feature amount which is a feature amount of each of a plurality of electrical devices installed in a predetermined unit in operation;
a measured data acquisition unit that acquires measured data of the predetermined unit which is at least one of a total current consumption, a total power consumption, and a voltage measured in the predetermined unit;

a feature amount extraction unit that acquires a measurement feature amount which is the feature amount included in the measured data of the predetermined unit;

a correction unit that corrects a first feature amount which is the device feature amount or the measurement feature amount in a direction in which a difference occurring between the device feature amount and the measurement feature amount due to disagreement between a measurement condition at the time of measurement of reference data for extracting the device feature amount and a measurement condition at the time of measurement of the measured data of the predetermined unit is cancelled; and a presumption unit that presumes the electrical device being in operation using the corrected first feature amount, and a second feature amount which is the device feature amount or the measurement feature amount, and a different feature amount from the first feature amount.

2. The monitoring device according to claim 1, wherein the correction unit corrects the first feature amount based on unit feature information indicating a feature of the predetermined unit.

3. The monitoring device according to claim 1, further comprising:

a correction information generation unit that generates correction information for cancelling a difference between the device feature amount and the measurement feature amount based on the device feature amount and the measurement feature amount, wherein the correction unit corrects the first feature amount based on the correction information.

4. The monitoring device according to claim 1, wherein the unit feature information includes at least one of information regarding an interconnect in the predetermined unit and information for specifying the electrical device connected to the interconnect in the predetermined unit.

5. The monitoring device according to claim 4, wherein the correction unit performs the correction in consideration of a feature of the predetermined unit as an LC circuit specified by setting the interconnect in the predetermined unit as inductance and regarding the electrical device connected to the interconnect in the predetermined unit as electrostatic capacitance.

6. The monitoring device according to claim 4, wherein the first and second correction units perform the correction in consideration of a feature of the predetermined unit as an LC circuit specified by setting the interconnect in the predetermined unit as inductance and regarding the electrical device connected to the interconnect in the predetermined unit as electrostatic capacitance.

7. A monitoring system comprising:
the monitoring device according to claim 1; and
a transmission device that acquires measured data of the predetermined unit which is at least one of a total current consumption, a total power consumption, and a voltage measured by a measuring instrument installed in the predetermined unit and transmits the measured data of the predetermined unit to the monitoring device.

8. A monitoring device comprising:
a feature amount storage unit that stores a device feature amount which is a feature amount of each of a plurality of electrical devices installed in a predetermined unit in operation;

a measured data acquisition unit that acquires measured data of the predetermined unit which is at least one of a total current consumption, a total power consumption, and a voltage measured in the predetermined unit;

a feature amount extraction unit that acquires a measurement feature amount which is the feature amount included in the measured data of the predetermined unit;

a first correction unit that corrects the device feature amount in a direction in which a difference occurring between the device feature amount and the measurement feature amount due to disagreement between a measurement condition at the time of measurement of reference data for extracting the device feature amount and a measurement condition at the time of measurement of the measured data of the predetermined unit is cancelled;

a second correction unit that corrects the measurement feature amount in a direction in which a difference occurring between the device feature amount and the measurement feature amount due to disagreement between a measurement condition at the time of measurement of the reference data and a measurement condition at the time of measurement of the measured data of the predetermined unit is cancelled; and a presumption unit that presumes the electrical device being in operation using the corrected device feature amount and the corrected measurement feature amount.

9. The monitoring device according to claim 8, wherein the first correction unit corrects the device feature amount based on unit feature information indicating a feature of the predetermined unit, and wherein the second correction unit corrects the measurement feature amount based on the unit feature information.

10. The monitoring device according to claim 8, further comprising:

a correction information generation unit that generates correction information for cancelling a difference between the device feature amount and the measurement feature amount based on the device feature amount and the measurement feature amount, wherein the first correction unit corrects the device feature amount based on the correction information, and wherein the second correction unit corrects the measurement feature amount based on the correction information.

11. A monitoring device comprising:
a feature amount storage unit that stores a device feature amount which is a feature amount of each of a plurality of electrical devices installed in a predetermined unit in operation;

a measured data acquisition unit that acquires measured data of the predetermined unit which is at least one of a total current consumption, a total power consumption, and a voltage measured in the predetermined unit;

a correction unit that corrects the measured data of the predetermined unit in a direction in which a difference occurring between the device feature amount and the measurement feature amount extracted from the measured data of the predetermined unit due to disagreement between a measurement condition at the time of measurement of reference data for extracting the device feature amount and a measurement condition at the time of measurement of the measured data of the predetermined unit is cancelled;

a feature amount extraction unit that acquires a corrected measurement feature amount which is the feature amount included in the corrected measured data of the predetermined unit; and
a presumption unit that presumes the electrical device being in operation using the device feature amount and the corrected measurement feature amount.

12. The monitoring device according to claim 11, wherein the correction unit corrects the measured data of the predetermined unit based on unit feature information indicating a feature of the predetermined unit.

13. The monitoring device according to claim 11, further comprising:
a correction information generation unit that generates correction information for cancelling a difference between the reference data and the measured data of the predetermined unit based on the reference data and the measured data of the predetermined unit from which the device feature amount is extracted,
wherein the correction unit corrects the measured data of the predetermined unit based on the correction information.

14. A monitoring device comprising:
a reference data storage unit that stores reference data which is at least one of a current consumption, a power consumption, and a voltage measured using each of a plurality of electrical devices installed in a predetermined unit, placed in a different environment from the predetermined unit;
a measured data acquisition unit that acquires measured data of the predetermined unit which is at least one of the total current consumption, the total power consumption, and the voltage measured in the predetermined unit;
a feature amount extraction unit that acquires a measurement feature amount which is the feature amount included in the measured data of the predetermined unit;
a correction unit that corrects the reference data of each of the plurality of electrical devices in a direction in which a difference occurring between device feature amount extracted from the reference data and the measurement feature amount due to disagreement between a measurement condition at the time of measurement of the reference data and a measurement condition at the time of measurement of the measured data of the predetermined unit is cancelled;
a corrected device feature amount generation unit that acquires a corrected device feature amount which is a feature amount of each of the electrical devices included in each piece of the corrected reference data; and
a presumption unit that presumes the electrical device being in operation using the corrected device feature amount and the measurement feature amount.

15. The monitoring device according to claim 14, wherein the correction unit corrects the reference data based on unit feature information indicating a feature of the predetermined unit.

16. The monitoring device according to claim 15, further comprising:
a correction information generation unit that generates correction information for cancelling a difference between the reference data and the measured data of the predetermined unit based on the reference data and the measured data of the predetermined unit,
wherein the correction unit corrects the reference data based on the correction information.

17. A monitoring device comprising:
a reference data storage unit that stores reference data which is at least one of a current consumption, a power consumption, and a voltage measured using each of a plurality of electrical devices installed in a predetermined unit, placed in a different environment from the predetermined unit;
a measured data acquisition unit that acquires measured data of the predetermined unit which is at least one of the total current consumption, the total power consumption, and the voltage measured in the predetermined unit;
a first correction unit that corrects the reference data of each of the plurality of electrical devices in a direction in which a difference occurring between a device feature amount extracted from the reference data and a measurement feature amount extracted from the measured data of the predetermined unit due to disagreement between a measurement condition at the time of measurement of the reference data and a measurement condition at the time of measurement of the measured data of the predetermined unit is cancelled;
a corrected device feature amount generation unit that acquires a corrected device feature amount which is a feature amount of each of the electrical devices included in each piece of the corrected reference data;
a second correction unit that corrects the measured data of the predetermined unit in a direction in which a difference occurring between the device feature amount and the measurement feature amount due to disagreement between a measurement condition at the time of measurement of the reference data and a measurement condition at the time of measurement of the measured data of the predetermined unit is cancelled;
a feature amount extraction unit that acquires a corrected measurement feature amount which is the feature amount included in the corrected measured data of the predetermined unit; and
a presumption unit that presumes the electrical device being in operation using the corrected device feature amount and the corrected measurement feature amount.

18. The monitoring device according to claim 17, wherein the first correction unit corrects the reference data based on unit feature information indicating a feature of the predetermined unit, and
wherein the second correction unit corrects the measured data of the predetermined unit based on the unit feature information indicating the feature of the predetermined unit.

19. The monitoring device according to claim 17, further comprising:
a correction information generation unit that generates correction information for cancelling a difference between the reference data and the measured data of the predetermined unit based on the reference data and the measured data of the predetermined unit,
wherein the first correction unit corrects the reference data based on the correction information, and
wherein the second correction unit corrects the measured data of the predetermined unit based on the correction information.

20. The monitoring device according to claim 1, wherein the device feature amount is a feature amount of each of the electrical devices extracted from reference data which is at least one of the current consumption, the power consumption, and the voltage measured using each of the plurality of electrical devices installed in the predetermined unit, placed in a different environment from the predetermined unit.

21. A monitoring method performed by a computer that stores in advance a device feature amount which is a feature amount of each of a plurality of electrical devices installed in a predetermined unit in operation, the method comprising:
  a measured data acquisition step of acquiring measured data of the predetermined unit which is at least one of a total current consumption, a total power consumption, and a voltage measured in the predetermined unit;
  a feature amount extraction step of acquiring a measurement feature amount which is the feature amount included in the measured data of the predetermined unit;
  a correction step of correcting a first feature amount which is the device feature amount or the measurement feature amount in a direction in which a difference occurring between a device feature amount extracted from the reference data and a measurement feature amount extracted from the measured data of the predetermined unit due to disagreement between a measurement condition at the time of measurement of the reference data and a measurement condition at the time of measurement of the measured data of the predetermined unit is cancelled; and
  a presumption step of presuming the electrical device being in operation using the corrected first feature amount, and a second feature amount which is the device feature amount or the measurement feature amount, and a different feature amount from the first feature amount.

22. A monitoring method performed by a computer that stores in advance a device feature amount which is a feature amount of each of a plurality of electrical devices installed in a predetermined unit in operation, the method comprising:
  a measured data acquisition step of acquiring measured data of the predetermined unit which is at least one of a total current consumption, a total power consumption, and a voltage measured in the predetermined unit;
  a feature amount extraction step of acquiring a measurement feature amount which is the feature amount included in the measured data of the predetermined unit;
  a first correction step of correcting the device feature amount in a direction in which a difference occurring between the device feature amount and the measurement feature amount due to disagreement between a measurement condition at the time of measurement of reference data for extracting the device feature amount and a measurement condition at the time of measurement of the measured data of the predetermined unit is cancelled;
  a second correction step that correcting the measurement feature amount in a direction in which a difference occurring between the device feature amount and the measurement feature amount due to disagreement between a measurement condition at the time of measurement of the reference data and a measurement condition at the time of measurement of the measured data of the predetermined unit is cancelled; and
  a presumption step of presuming the electrical device being in operation using the corrected device feature amount and the corrected measurement feature amount.

23. A monitoring method performed by a computer that stores in advance a device feature amount which is a feature amount of each of a plurality of electrical devices installed in a predetermined unit in operation, the method comprising:
  a measured data acquisition step of acquiring measured data of the predetermined unit which is at least one of a total current consumption, a total power consumption, and a voltage measured in the predetermined unit;
  a correction step of correcting the measured data of the predetermined unit in a direction in which a difference occurring between the device feature amount and the measurement feature amount extracted from the measured data of the predetermined unit due to disagreement between a measurement condition at the time of measurement of reference data for extracting the device feature amount and a measurement condition at the time of measurement of the measured data of the predetermined unit is cancelled;
  a feature amount extraction step of acquiring a corrected measurement feature amount which is the feature amount included in the corrected measured data of the predetermined unit; and
  a presumption step of presuming the electrical device being in operation using the device feature amount and the corrected measurement feature amount.

24. A monitoring method performed by a computer that stores in advance reference data which is at least one of a current consumption, a power consumption, and a voltage measured using each of a plurality of electrical devices installed in a predetermined unit, placed in a different environment from the predetermined unit, the method comprising:
  a measured data acquisition step of acquiring measured data of the predetermined unit which is at least one of the total current consumption, the total power consumption, and the voltage measured in the predetermined unit;
  a feature amount extraction step of acquiring a measurement feature amount which is the feature amount included in the measured data of the predetermined unit;
  a correction step of correcting the reference data of each of the plurality of electrical devices in a direction in which a difference occurring between device feature amount extracted from the reference data and the measurement feature amount due to disagreement between a measurement condition at the time of measurement of the reference data and a measurement condition at the time of measurement of the measured data of the predetermined unit is cancelled;
  a corrected device feature amount generation step of acquiring a corrected device feature amount which is a feature amount of each of the electrical devices included in each piece of the corrected reference data; and
  a presumption step of presuming the electrical device being in operation using the corrected device feature amount and the measurement feature amount.

25. A monitoring method performed by a computer that stores in advance reference data which is at least one of a current consumption, a power consumption, and a voltage measured using each of a plurality of electrical devices installed in a predetermined unit, placed in a different environment from the predetermined unit, the method comprising:
  a measured data acquisition step of acquiring measured data of the predetermined unit which is at least one of the total current consumption, the total power consumption, and the voltage measured in the predetermined unit;

a first correction step of correcting the reference data of each of the plurality of electrical devices in a direction in which a difference occurring between a device feature amount extracted from the reference data and a measurement feature amount extracted from the measured data of the predetermined unit due to disagreement between a measurement condition at the time of measurement of the reference data and a measurement condition at the time of measurement of the measured data of the predetermined unit is cancelled;

a corrected device feature amount generation step of acquiring a corrected device feature amount which is a feature amount of each of the electrical devices included in each piece of the corrected reference data;

a second correction step of correcting the measured data of the predetermined unit in a direction in which a difference occurring between the device feature amount and the measurement feature amount due to disagreement between a measurement condition at the time of measurement of the reference data and a measurement condition at the time of measurement of the measured data of the predetermined unit is cancelled;

a feature amount extraction step of acquiring a corrected measurement feature amount which is the feature amount included in the corrected measured data of the predetermined unit; and a presumption step of presuming the electrical device being in operation using the corrected device feature amount and the corrected measurement feature amount.

26. A non-transitory storage medium storing a program causing a computer to function as:

a feature amount storage unit that stores a device feature amount which is a feature amount of each of a plurality of electrical devices installed in a predetermined unit in operation;

a measured data acquisition unit that acquires measured data of the predetermined unit which is at least one of a total current consumption, a total power consumption, and a voltage measured in the predetermined unit;

a feature amount extraction unit that acquires a measurement feature amount which is the feature amount included in the measured data of the predetermined unit;

a correction unit that corrects a first feature amount which is the device feature amount or the measurement feature amount in a direction in which a difference occurring between the device feature amount and the measurement feature amount due to disagreement between a measurement condition at the time of measurement of reference data for extracting the device feature amount and a measurement condition at the time of measurement of the measured data of the predetermined unit is cancelled; and a presumption unit that presumes the electrical device being in operation using the corrected first feature amount, and a second feature amount which is the device feature amount or the measurement feature amount, and a different feature amount from the first feature amount.

27. A non-transitory storage medium storing a program causing a computer to function as:

a feature amount storage unit that stores a device feature amount which is a feature amount of each of a plurality of electrical devices installed in a predetermined unit in operation;

a measured data acquisition unit that acquires measured data of the predetermined unit which is at least one of a total current consumption, a total power consumption, and a voltage measured in the predetermined unit;

a feature amount extraction unit that acquires a measurement feature amount which is the feature amount included in the measured data of the predetermined unit;

a first correction unit that corrects the device feature amount in a direction in which a difference occurring between a device feature amount extracted from the reference data and a measurement feature amount extracted from the measured data of the predetermined unit due to disagreement between a measurement condition at the time of measurement of the reference data and a measurement condition at the time of measurement of the measured data of the predetermined unit is cancelled;

a second correction unit that corrects the measurement feature amount in a direction in which a difference occurring between the device feature amount and the measurement feature amount due to disagreement between a measurement condition at the time of measurement of the reference data and a measurement condition at the time of measurement of the measured data of the predetermined unit is cancelled; and a presumption unit that presumes the electrical device being in operation using the corrected device feature amount and the corrected measurement feature amount.

28. A non-transitory storage medium storing a program causing a computer to function as:

a feature amount storage unit that stores a device feature amount which is a feature amount of each of a plurality of electrical devices installed in a predetermined unit in operation;

a measured data acquisition unit that acquires measured data of the predetermined unit which is at least one of a total current consumption, a total power consumption, and a voltage measured in the predetermined unit;

a correction unit that corrects the measured data of the predetermined unit in a direction in which a difference occurring between the device feature amount and the measurement feature amount due to disagreement between a measurement condition at the time of measurement of reference data for extracting the device feature amount and a measurement condition at the time of measurement of the measured data of the predetermined unit is cancelled;

a feature amount extraction unit that acquires a corrected measurement feature amount which is the feature amount included in the corrected measured data of the predetermined unit; and a presumption unit that presumes the electrical device being in operation using the device feature amount and the corrected measurement feature amount.

29. A non-transitory storage medium storing a program causing a computer to function as:

a reference data storage unit that stores reference data which is at least one of a current consumption, a power consumption, and a voltage measured using each of a plurality of electrical devices installed in a predetermined unit, placed in a different environment from the predetermined unit;

a measured data acquisition unit that acquires measured data of the predetermined unit which is at least one of the total current consumption, the total power consumption, and the voltage measured in the predetermined unit;

a feature amount extraction unit that acquires a measurement feature amount which is the feature amount included in the measured data of the predetermined unit;

a correction unit that corrects the reference data of each of the plurality of electrical devices in a direction in which a difference occurring between device feature amount extracted from the reference data and the measurement feature amount due to disagreement between a measurement condition at the time of measurement of the reference data and a measurement condition at the time of measurement of the measured data of the predetermined unit is cancelled;

a corrected device feature amount generation unit that acquires a corrected device feature amount which is a feature amount of each of the electrical devices included in each piece of the corrected reference data; and a presumption unit that presumes the electrical device being in operation using the corrected device feature amount and the measurement feature amount.

30. A non-transitory storage medium storing a program causing a computer to function as:

a reference data storage unit that stores reference data which is at least one of a current consumption, a power consumption, and a voltage measured using each of a plurality of electrical devices installed in a predetermined unit, placed in a different environment from the predetermined unit;

a measured data acquisition unit that acquires measured data of the predetermined unit which is at least one of the total current consumption, the total power consumption, and the voltage measured in the predetermined unit;

a first correction unit that corrects the reference data of each of the plurality of electrical devices in a direction in which a difference occurring between a device feature amount extracted from the reference data and a measurement feature amount extracted from the measured data of the predetermined unit due to disagreement between a measurement condition at the time of measurement of the reference data and a measurement condition at the time of measurement of the measured data of the predetermined unit is cancelled;

a corrected device feature amount generation unit that acquires a corrected device feature amount which is a feature amount of each of the electrical devices included in each piece of the corrected reference data;

a second correction unit that corrects the measured data of the predetermined unit in a direction in which a difference occurring between the device feature amount and the measurement feature amount due to disagreement between a measurement condition at the time of measurement of the reference data and a measurement condition at the time of measurement of the measured data of the predetermined unit is cancelled;

a feature amount extraction unit that acquires a corrected measurement feature amount which is the feature amount included in the corrected measured data of the predetermined unit; and a presumption unit that presumes the electrical device being in operation using the corrected device feature amount and the corrected measurement feature amount.

* * * * *